United States Patent
Hussell et al.

(10) Patent No.: US 9,538,590 B2
(45) Date of Patent: Jan. 3, 2017

(54) SOLID STATE LIGHTING APPARATUSES, SYSTEMS, AND RELATED METHODS

(71) Applicant: Cree, Inc., Durham, NC (US)

(72) Inventors: Christopher P. Hussell, Cary, NC (US); Jeremy Allen Johnson, Fuquay Varina, NC (US); Craig William Hardin, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/639,743

(22) Filed: Mar. 5, 2015

(65) Prior Publication Data

US 2015/0282260 A1 Oct. 1, 2015

Related U.S. Application Data

(63) Continuation-in-part of application No. 13/436,247, filed on Mar. 30, 2012, now Pat. No. 8,895,998.
(Continued)

(51) Int. Cl.
*H01L 25/16* (2006.01)
*H05B 33/08* (2006.01)
(Continued)

(52) U.S. Cl.
CPC ......... *H05B 33/0806* (2013.01); *H01L 25/167* (2013.01); *H01L 25/50* (2013.01);
(Continued)

(58) Field of Classification Search
CPC ...... H01L 25/0753; H01L 25/50; H01L 24/48; H01L 2225/48227; H01L 22/642; H01L 33/60; H01L 24/73; H01L 33/642; H01L 2224/48091; H01L 33/10; H01L 33/08
(Continued)

(56) References Cited

U.S. PATENT DOCUMENTS

| 4,946,547 A | 8/1990 | Palmour |
| 5,200,022 A | 4/1993 | Kong |

(Continued)

FOREIGN PATENT DOCUMENTS

| JP | H06291236 A | 10/1994 |
| JP | 2001 131517 A | 5/2001 |

(Continued)

OTHER PUBLICATIONS

"DuPont Ti-Pure titanium dioxide, Titanium Dioxide for Coatings," Jan. 2012, pp. 1-28, DuPont, USA.
(Continued)

*Primary Examiner* — Jarrett Stark
*Assistant Examiner* — Shahed Ahmed
(74) *Attorney, Agent, or Firm* — Jenkins, Wilson, Taylor & Hunt, P.A.

(57) ABSTRACT

Solid state lighting apparatuses and related methods are described. In some aspects, a solid state lighting apparatus includes a substrate. The substrate includes a non-metallic body having a first surface and one or more electrical components supported on the first surface of the substrate. At least one electrical component is spaced from the non-metallic body by one or more non-metallic layers. The apparatus can also include an array of solid state light emitters supported by the first surface of the substrate and electrically coupled to the one or more electrical components thereof. The apparatus can further include a receiver supported by the first surface of the substrate, wherein the receiver is adapted to receive alternating current (AC) directly from an AC power source. Related systems and methods are also disclosed.

53 Claims, 15 Drawing Sheets

Related U.S. Application Data

(60) Provisional application No. 61/948,359, filed on Mar. 5, 2014.

(51) Int. Cl.

| | | |
|---|---|---|
| *H01L 25/00* | (2006.01) | |
| *H01L 25/075* | (2006.01) | |
| *H01L 33/60* | (2010.01) | |
| *H01L 33/64* | (2010.01) | |
| *H01L 23/00* | (2006.01) | |
| *H05K 1/02* | (2006.01) | |
| *H05K 1/18* | (2006.01) | |
| *H05K 3/00* | (2006.01) | |
| *F21S 8/02* | (2006.01) | |
| *F21V 29/74* | (2015.01) | |
| *F21Y 101/00* | (2016.01) | |

(52) U.S. Cl.
CPC . *F21K 9/20* (2016.08); *F21S 8/02* (2013.01); *F21V 29/74* (2015.01); *F21Y 2101/00* (2013.01); *F21Y 2105/10* (2016.08); *F21Y 2115/10* (2016.08); *H01L 24/48* (2013.01); *H01L 24/73* (2013.01); *H01L 25/0753* (2013.01); *H01L 33/60* (2013.01); *H01L 33/642* (2013.01); *H01L 2224/48091* (2013.01); *H01L 2224/48095* (2013.01); *H01L 2224/48137* (2013.01); *H01L 2224/48139* (2013.01); *H01L 2224/48227* (2013.01); *H01L 2224/73265* (2013.01); *H01L 2924/00014* (2013.01); *H05K 1/0203* (2013.01); *H05K 1/181* (2013.01); *H05K 3/0061* (2013.01); *H05K 2201/10106* (2013.01); *H05K 2201/2054* (2013.01); *Y10T 29/49002* (2015.01); *Y10T 29/4913* (2015.01); *Y10T 29/49227* (2015.01)

(58) Field of Classification Search
USPC ......... 257/53, 79, 83, 88, 194; 438/116, 167
See application file for complete search history.

(56) References Cited

U.S. PATENT DOCUMENTS

| | | |
|---|---|---|
| RE34,861 E | 2/1995 | Davis |
| 6,600,175 B1 | 7/2003 | Baretz et al. |
| 6,661,081 B2 | 12/2003 | Miyaki et al. |
| 6,795,461 B1* | 9/2004 | Blair ............... G02B 6/4292 372/101 |
| 7,391,046 B2 | 6/2008 | Tsutsumi et al. |
| 7,648,775 B2 | 1/2010 | Wakako et al. |
| 7,791,061 B2 | 9/2010 | Edmond et al. |
| D626,666 S | 11/2010 | Yamamoto et al. |
| 7,825,422 B2 | 11/2010 | Maeda et al. |
| 7,989,840 B2 | 8/2011 | Sanpei et al. |
| 8,018,135 B2 | 9/2011 | Van de Ven et al. |
| 8,058,088 B2 | 11/2011 | Cannon |
| 8,115,369 B2 | 2/2012 | Kang et al. |
| 8,188,687 B2 | 5/2012 | Lee et al. |
| 8,408,748 B2 | 4/2013 | Janik et al. |
| 8,415,693 B2 | 4/2013 | Inobe et al. |
| 8,456,739 B2* | 6/2013 | Stuettler ............ A61B 19/5223 359/368 |
| 8,476,836 B2 | 7/2013 | Van de Ven et al. |
| 8,508,140 B2 | 8/2013 | Leung et al. |
| 8,563,339 B2 | 10/2013 | Tarsa et al. |
| 8,564,000 B2 | 10/2013 | Hussell et al. |
| 8,575,639 B2 | 11/2013 | Hussell |
| 8,624,271 B2 | 1/2014 | Reiherzer et al. |
| 8,629,476 B2 | 1/2014 | Inoguchi |
| 8,643,271 B2 | 2/2014 | Shimonishi et al. |
| 8,692,281 B2 | 4/2014 | Su et al. |
| 8,766,313 B2 | 7/2014 | Kashitani et al. |
| 8,895,998 B2 | 11/2014 | Hussell et al. |
| 8,940,561 B2 | 1/2015 | Donofrio et al. |
| 9,024,349 B2 | 5/2015 | Chitnis et al. |
| 9,024,350 B2 | 5/2015 | Loh |
| 9,131,561 B2 | 9/2015 | Athalye |
| 9,159,888 B2 | 10/2015 | Chitnis et al. |
| 9,172,012 B2 | 10/2015 | Andrews et al. |
| 2001/0002139 A1* | 5/2001 | Hiraoka .................. B41J 2/45 347/238 |
| 2004/0027761 A1* | 2/2004 | Fukui ..................... G06F 3/041 361/100 |
| 2007/0029664 A1 | 2/2007 | Mohammed et al. |
| 2007/0062433 A1* | 3/2007 | Hurwitz ............... A01K 27/006 114/230.2 |
| 2008/0043444 A1* | 2/2008 | Hasegawa ............ H01L 33/642 361/717 |
| 2008/0211421 A1* | 9/2008 | Lee .................... H05B 33/0806 315/250 |
| 2008/0258130 A1 | 10/2008 | Bergmann |
| 2010/0078669 A1 | 4/2010 | Cho et al. |
| 2011/0111537 A1 | 5/2011 | Cheng et al. |
| 2011/0204409 A1* | 8/2011 | Sung .................... H05K 1/0373 257/99 |
| 2011/0260200 A1 | 10/2011 | Chen |
| 2012/0250310 A1 | 10/2012 | Hussell et al. |
| 2012/0313135 A1 | 12/2012 | Kashitani et al. |
| 2013/0003375 A1 | 1/2013 | Hussell |
| 2013/0069536 A1 | 3/2013 | Ni |
| 2013/0200406 A1 | 8/2013 | Hussell |
| 2013/0200420 A1 | 8/2013 | Hussell |

FOREIGN PATENT DOCUMENTS

| | | |
|---|---|---|
| JP | 2010 199167 A | 9/2010 |
| JP | 5459623 B2 | 4/2014 |
| KR | 10 0505838 | 10/2005 |
| KR | 20 2008 0002564 U | 7/2008 |
| KR | 20 2011 0008161 U | 8/2011 |
| KR | 10 2011 0104336 | 9/2011 |
| WO | WO 2012/109225 A1 | 8/2012 |
| WO | WO 2013/148573 | 10/2013 |
| WO | WO 2014/093813 A1 | 6/2014 |
| WO | WO 2015/142537 A1 | 9/2015 |

OTHER PUBLICATIONS

"Technical Guide, Reflectance Materials and Coatings," Jan. 2012, pp. 1-26, Labsphere, USA.
"Thick-Film Ceramic Substrates Design Guide," Mar. 2012, pp. 1-16, CoorsTek, Colorado, USA.
Non-Final Office Action for U.S. Appl. No. 13/435,912 dated Jan. 11, 2013.
Notice of Allowance for U.S. Appl. No. 13/435,912 dated Jun. 19, 2013.
International Search Report and Written Opininon for Application No. PCT/US2013/033704 dated Jun. 26, 2013.
Restriction Requirement for U.S. Appl. No. 13/436,247 dated Aug. 1, 2013.
Non-Final Office Action for U.S. Appl. No. 13/436,247 dated Nov. 7, 2013.
International Search Report and Written Opininon for Application No. PCT/US2013/074998 dated Apr. 3, 2014.
Restriction Requirement for U.S. Appl. No. 13/836,940 dated Jun. 17, 2014.
Notice of Allowance for U.S. Appl. No. 13/436,247 dated Jun. 18, 2014.
Non-Final Office Action for U.S. Appl. No. 13/836,709 dated Sep. 30, 2014.
Non-Final Office Action for U.S. Appl. No. 13/836,940 dated Oct. 7, 2014.
Restriction Requirement for U.S. Appl. No. 29/452,692 dated Dec. 4, 2014.
International Search Report for Application No. PCT/US 2015/018964, dated Jan. 9, 2015.

(56) References Cited

OTHER PUBLICATIONS

Final Office Action for U.S. Appl. No. 13/836,709 dated Apr. 9, 2015.
Notice of Allowance for U.S. Appl. No. 29/452,692 dated Apr. 13, 2015.
Final Office Action for U.S. Appl. No. 13/836,940 dated Apr. 17, 2015.
Restriction Requirement for U.S. Appl. No. 13/367,929 dated May 11, 2015.
Advisory Action for U.S. Appl. No. 13/836,709 dated Jun. 23, 2015.
Notice of Allowance for U.S. Appl. No. 29/452,692 dated Jul. 24, 2015.
Notice of Allowance for U.S. Appl. No. 29/452,692 dated Aug. 7, 2015.

* cited by examiner

SOLID STATE LIGHTING APPARATUSES, SYSTEMS, AND RELATED METHODS

CROSS REFERENCE TO RELATED APPLICATIONS

This application claims priority to U.S. Patent Application Ser. No. 61/948,359, filed on Mar. 5, 2014. This application is also a continuation-in-part of and claims priority to U.S. patent application Ser. No. 13/436,247, filed on Mar. 30, 2012. The disclosures of each of the above applications are incorporated by reference herein in the entirety.

TECHNICAL FIELD

The present subject matter generally relates to lighting apparatuses, systems, and related methods and, more particularly, to solid state lighting apparatuses and related methods.

BACKGROUND

Solid state lighting emitters are used in a variety of lighting apparatuses in, for example, commercial, automotive, and consumer lighting applications. Solid state emitters can comprise, for example, one or more unpackaged light emitting diode (LED) chips, one or more packaged LED chips, wherein the chips can comprise inorganic and/or organic LED chips (OLEDs). Solid state emitters generate light through the recombination of electronic carriers (electrons and holes) in a light emitting layer or region of an LED chip. LED chips have significantly longer lifetimes and a greater luminous efficiency than conventional incandescent and fluorescent light sources. However, as LED chips are narrow-bandwidth light emitters, it can be challenging to simultaneously provide good color rendering in combination with high luminous efficacy while maintain a maximizing brightness and efficiency.

Incandescent bulbs tend to produce a natural and aesthetically pleasing illumination compared to other types of conventional lighting apparatuses. In particular, incandescent bulbs typically range from a color temperature of about 2700K at full brightness, a color temperature of about 2000K at 5% brightness, and a color temperature of about 1800K at about 1% brightness. This compares favorably with daylight, which varies from about 6500K at midday to about 2500K at sunrise and sunset.

Research indicates that people tend to prefer warmer color temperatures (e.g., approximately 2700K to 3000K) at low brightness levels in intimate settings. LED lighting manufacturers are challenged with providing lighting sources or apparatuses utilizing LED chips to generate light having a color behavior that approximates the behavior of incandescent lighting. Another challenge exists in achieving dimmable color behavior via LED chip based lighting apparatuses that approximate the dimmable characteristics of incandescent lighting.

Conventional lighting systems can be powered via an alternating current (AC) source, however; they typically require a costly AC-DC power converter. To avoid the disadvantages and costs associated with AC-DC power converters, conventional LED chip based lighting sources are configured to operate directly from an AC power source without AC-DC conversion. In conventional driving schemes, some groups of LED chips are powered "on" when the amplitude of the AC waveform is positive, and other groups of LED chips are power "on" when the amplitude of the AC waveform is negative. This results in perceptible flicker and reduced efficiency. A challenge exists in achieving LED chip based light sources configured to operate directly from an AC power source with imperceptible flicker.

Another challenge associated with utilizing LED chips in a lighting source lacking an AC-DC power converter is thermal management, including efficiently dissipating heat generated by LED chips without overheating individual chips (which would shorten LED chip lifetime) and without needlessly increasing heatsink area (which would increase cost and size of a light source).

Accordingly, a need exists for improved solid state lighting apparatuses, systems, and/or improved methods including use and provision of solid state lighting apparatuses that can be directly coupled to an AC voltage signal or AC power, without requiring use of an on-board switched mode power supply. Desirable solid state lighting apparatuses, systems, and methods would exhibit improved light extraction, brightness, and/or improved thermal management. Desirable apparatuses, systems, and methods would also exhibit reduced cost and make it easier for end-users to justify switching to LED products from a return on investment or payback perspective.

SUMMARY

Solid state lighting apparatuses adapted to operate with alternating current (AC) received directly from an AC power source and related methods are disclosed. In some aspects, a solid state lighting apparatus includes a substrate. The substrate comprises a non-metallic body having a first surface and one or more electrical components supported on the first surface of the substrate. At least one electrical component is spaced from the non-metallic body by one or more non-metallic layers. The apparatus can also comprise an array of solid state light emitters supported by the first surface of the substrate and electrically coupled to the one or more electrical components thereof. The apparatus can further comprise a receiver supported by the first surface of the substrate, wherein the receiver is adapted to receive alternating current (AC) directly from an AC power source.

In some aspects, a solid state lighting system is disclosed. The system comprises a substrate comprising a non-metallic body and one or more non-metallic layers. The non-metallic body has a top surface. One or more solid state light emitters are disposed on the top surface. One or more electrical components are mounted on the top surface and electrically coupled to the one or more solid state light emitters. At least one electrical component is spaced from the non-metallic body by the one or more non-metallic layers. One or more electrically conductive vias can be provided in at least one non-metallic layer disposed between the at least one electrical component and the non-metallic body of the substrate.

In some aspects, a method of providing a solid state lighting apparatus is disclosed. The method comprises providing a substrate having a non-metallic body and a first surface. One or more electrical components are mounted on the first surface of the substrate. At least one electrical component is spaced from the non-metallic body by one or more non-metallic layers. The method further comprises arranging an array of solid state light emitters over the first surface of the substrate. The solid state light emitters are electrically coupled to the one or more electrical components thereof. The method further comprises providing a receiver supported by the first surface of the substrate, wherein the receiver is adapted to receive alternating current (AC) directly from an AC power source.

Other aspects, features and embodiments of the subject matter will be more fully apparent from the ensuing disclosure and appended claims. Apparatuses, systems, and methods provided herein can include improved dimming capabilities, improved thermal management capabilities, and improved brightness. These and other objects can be achieved according to the subject matter herein.

BRIEF DESCRIPTION OF DRAWINGS

A full and enabling disclosure of the present subject matter is set forth more particularly in the remainder of the specification, including reference to the accompanying figures, relating to one or more embodiments, in which.

DETAILED DESCRIPTION

Figure 1:
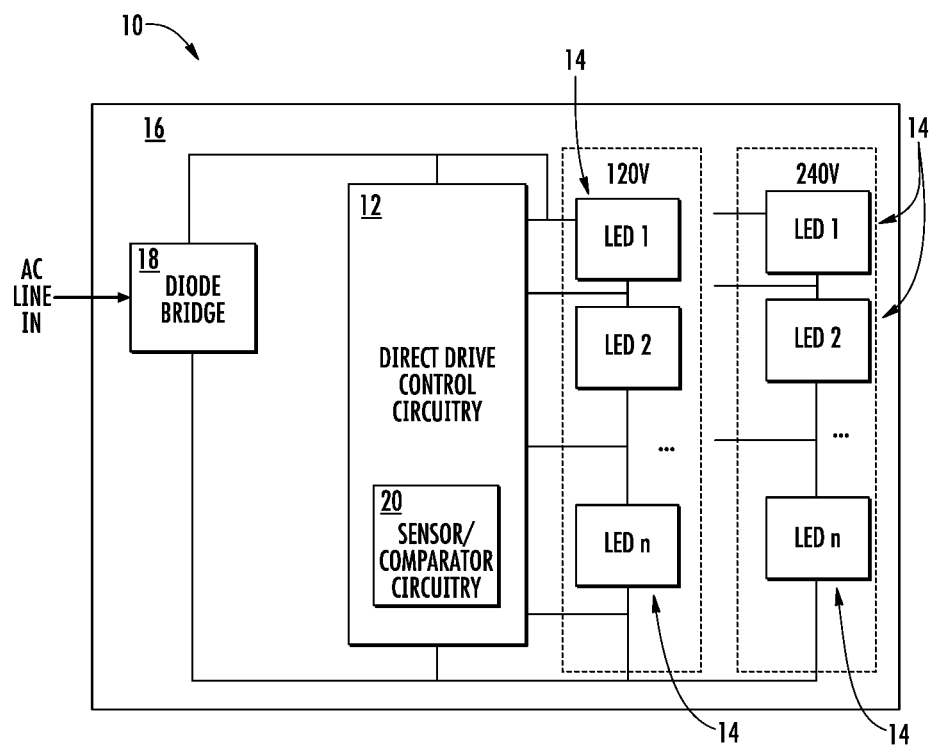
FIG. 1 is a schematic block diagram illustrating a solid state lighting apparatus according to some aspects.

The present subject matter relates in certain aspects to solid state lighting apparatuses adapted to operate with alternating current (AC) received directly from an AC power source and related methods. Exemplary solid state lighting apparatuses can comprise a substrate and multiple sets of one or more solid state light emitters arranged on or supported by the substrate. At least first and second sets of the multiple sets of solid state light emitters can be configured to be activated and/or deactivated at different times relevant to one another during a portion of an AC cycle. Apparatuses disclosed herein can comprise elements and/or configurations arranged to reduce physical interference between solid state light emitters and functional components (e.g., driver circuit components), thereby enhancing light extraction.

In some aspects, solid state lighting apparatuses and systems described herein can comprise various emitter configurations, color combinations, and/or circuit components adapted to reduce perceivable flicker, perceptible color shifts, and/or perceptible spatial variations in luminous flux that could potentially occur during activation and/or deactivation of multiple sets of different solid state light emitters.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter" and "emitter" as used herein refer to any device capable of producing visible or near visible (e.g., from infrared to ultraviolet) wavelength radiation, including but not limited to, xenon lamps, mercury lamps, sodium lamps, incandescent lamps, and solid state emitters, including light emitting diodes (LEDs or LED chips), organic light emitting diodes (OLEDs), and lasers.

The terms "solid state light emitter" or "solid state emitter" refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", or "sets" as used herein are synonymous terms. As used herein, these terms generally describe how multiple LED chips are electrically connected in series, in parallel, or in mixed series/parallel configurations among mutually exclusive groups/segments/sets.

The LED "segment" further refers to a separately switched portion of a string of LED chips. A segment can include at least one LED chip, which can itself include a number of serially connected epi junctions used to provide a chip that has a particular forward voltage, such as 3V, 6V, 9V, etc. where a single epi junction may have a forward voltage of about 1.5 volts. Each segment can also comprise multiple LED chips that are connected in various parallel and/or serial arrangements. The segments of LED chips can be configured in a number of different ways and may have various compensation circuits associated therewith, as discussed, for example, in commonly assigned and co-pending U.S. patent application Ser. No. 13/235,103 and U.S. patent application Ser. No. 13/235,127, the disclosure of each of which is hereby incorporated by reference herein.

The term "targeted" refers to configurations of LED chip segments that are configured to provide a pre-defined lighting characteristic that is a specified parameter for the lighting apparatus. For example, a targeted spectral power distribution can be a spectral power distribution that is specified for the light provided by the apparatus as a result of dimming the light. In particular, the targeted spectral power distribution can describe the characteristic of the light that is generated at a particular dimming level. In some aspects, the targeted spectral power distribution can be specified on the packaging of the lighting apparatus or otherwise in conjunction with the advertising or marketing of the lighting apparatus. Furthermore, the targeted spectral power distribution can be associated with the lighting characteristics of two or more specified dimming levels, such as a low light level and a higher light level. Accordingly, the targeted spectral power distribution can be provided as the light shifts from "full on" to more dimming as well a shift in the reverse direction toward "full on."

LED chips can be characterized as having a particular spectral power distribution, which can affect various light characteristics of the light emitted by the chip. A spectral power distribution can be used to express the power per unit area per unit wavelength of an illumination (radiant exitance), or more generally, the per wavelength contribution to any radiometric quantity (such as radiant energy, radiant flux, radiant intensity, radiance, irradiance, radiant exitance, and/or radiosity, etc.). A spectral power distribution can be normalized in some manner, such as, to unity at 555 or 560 nanometers (nm), coinciding with the peak of the eye's luminosity function, in addition to the light characteristics described herein, such as CRI, CCT, CX and CY, etc.

In some aspects, LED segments are separately and/or selectively switched "on" and "off", each of which can have a respective spectral power distribution and/or CCT color temperature. Further, at least one of the LED segments can be populated with LED chips of a particular spectral power distribution that is the target value for dimming. In operation, an LED segment drive circuit, for example, comprising a packaged drive circuitry (e.g., a driver chip) can selectively switch the string current through the LED segments so that the overall spectral power distribution of light generated by the apparatus shifts toward a targeted spectral power distribution as dimming proceeds. LED segments can be activated and/or deactivated via driver chip during different portions of an AC waveform. For example, a full spectral power distribution may be provided by the driver chip to switch current through a combination of one or all of the LED segments.

The term "substrate" as used herein in connection with lighting apparatuses refers to a mounting member or element on which, in which, or over which, multiple solid state light emitters (e.g., LED chips) can be arranged, supported, and/or mounted. Exemplary substrates useful with lighting apparatuses as described herein comprise printed circuit boards (including but not limited to metal core printed circuit boards, flexible circuit boards, dielectric laminates, ceramic based substrates, and the like) having electrical traces arranged on one or multiple surfaces thereof, support panels, and mounting elements of various materials and conformations arranged to receive, support, and/or conduct electrical power to solid state emitters. Electrical traces described herein can be visible and/or covered via a reflective covering, such as a solder mask.

In some aspects, a single, unitary substrate can be used to support multiple groups of solid state emitters and can further be used to support related circuits and/or circuit elements, such as driver circuit elements, rectifier circuit elements (e.g., a rectifier bridge), comparator circuits, and/or dimmer circuit elements housed within a driver or driver chip.

Solid state lighting apparatuses according to aspects of the subject matter herein can comprise III-V nitride (e.g., gallium nitride) based LED chips or laser chips fabricated on a silicon, silicon carbide, sapphire, or III-V nitride growth substrate, including (for example) chips manufactured and sold by Cree, Inc. of Durham, N.C. Such LED chips and/or lasers can be configured to operate such that light emission occurs through the substrate in a so-called "flip chip" orientation. Such LED and/or laser chips can also be devoid of growth substrates (e.g., following growth substrate removal).

LED chips useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit one or more beams to stimulate emissions of one or more lumiphoric materials (e.g., phosphors, scintillators, lumiphoric inks, quantum dots) to generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LED chips having a planarized coating of phosphor integrated therewith are discussed by way of example in U.S. Patent Application Publication No. 2008/0179611 to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LED chips of different colors, one or more of which can be white emitting (e.g., including at least one LED chip with one or more lumiphoric materials).

In some aspects, one or more short wavelength solid state emitters (e.g., blue and/or cyan LED chips) can be used to stimulate emissions from a mixture of lumiphoric materials, or discrete layers of lumiphoric material, including red, yellow, and green lumiphoric materials. LED chips of different wavelengths can be present in the same group of solid state emitters, or can be provided in different groups of solid state emitters.

Dimming effects, where the CCT of the light source changes when dimmed, can be achieved by mixing red/orange (RDO), amber, blue shifted yellow (BSY), warm white, and other LED chips or die that produce different colors in a direct drive configuration are provided. In a dim to warm example, LED chips combine to produce a desired end CCT point will be used and connected to a direct drive controller, such as a driver or power chip. In low dimming instances, one string will be the only string active in a direct drive topology. As the other strings turn on, cooler LED chips are used to increase the color temperature. This change in CCT will behave in the opposite manner as the dimming level is decreased. Mixing different color LED chips in different targeted strings will allow for color change while dimming and decrease the CCT of the LED source.

The expression "peak wavelength", as used herein, means (1) in the case of a solid state light emitter, the peak wavelength of light that the solid state light emitter emits if it is illuminated, and (2) in the case of a lumiphoric material, the peak wavelength of light that the lumiphoric material emits if it is excited.

A wide variety of wavelength conversion materials (e.g., luminescent materials, also known as lumiphors or lumiphoric media, e.g., as disclosed in U.S. Pat. No. 6,600,175 and U.S. Patent Application Publication No. 2009/0184616), are well-known and available to persons of skill in the art. Examples of luminescent materials (lumiphors) comprise phosphors, scintillators, day glow tapes, nanophosphors, quantum dots (e.g., such as provided by NNCrystal US Corp. (Fayetteville, Ark.)), and inks that glow in the visible spectrum upon illumination with (e.g., ultraviolet) light. One or more luminescent materials useable in apparatuses as described herein can be down-converting or up-converting, or can comprise a combination of both types.

Aspects relating to the subject matter disclosed herein can be better understood with reference to the 1931 CIE (Commission International de l'Eclairage) Chromaticity Diagram, which is well-known and readily available to those of ordinary skill in the art. The 1931 CIE Chromaticity Diagram maps out the human color perception in terms of two CIE parameters, namely x and y. The spectral colors are distributed around the edge of the outlined space, which comprises all of the hues perceived by the human eye. The boundary line represents maximum saturation for the spectral colors. The blackbody locus is a set of chromaticity coordinates (x, y) determined by the spectral power distributions of blackbody radiators according to Planck's Law: $E(\lambda)=\lambda^{-5}/(e^{B/T}-1)$, where E is the emission intensity, $\lambda$ is the emission wavelength, T the color temperature of the blackbody, and A and B are constants. Color temperatures from about 1800 K to about 2700 K have a more red hue and are desirable for dimming. While LED light sources typically have spectral power distributions that deviate from the "ideal" Planck's Law (blackbody), they can be made to have a corresponding x, y coordinate and CCT and will thus appear to have the same color as the ideal blackbody. Color coordinates that lie on or near the blackbody locus yield pleasing white light to a human observer.

The 1931 CIE Diagram comprises temperature listings along the blackbody locus from about 2700 K to about 6000K (embodying a curved line emanating from the right corner). These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants, such as apparatuses disclosed herein, which produce light that is on or near the blackbody locus can be described in terms of their color temperature.

The expression "lighting apparatus" as used herein, is not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, or any other light emitting device.

In some aspects, a lighting apparatus as described herein is devoid of any AC-to-DC converter in electrical communication between the AC power source and multiple sets (e.g., disposed in an array) of solid state light emitters. In some aspects, a lighting apparatus as described herein comprises at least one driving circuit (or multiple driving circuits in some aspects) packaged or housed within a chip (e.g., an integrated circuit (IC) power chip) and arranged in electrical communication between an AC source and multiple sets of solid state light emitters. In some aspects, a lighting apparatus as described herein comprises at least one rectifier bridge (or multiple rectifier bridges in some aspects) arranged in electrical communication between an AC source and multiple sets of solid state light emitters for rectifying the AC signal.

In some aspects, a lighting apparatus as described herein comprises multiple sets of solid state light emitters that are configured to be activated and/or deactivated at different times relative to one another during a portion of an AC cycle, and each set of the multiple sets comprises at least a first solid state light emitter segment targeting a first color and at least a second solid state light emitter segment targeting a second color that is different than the first color. In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters).

In some aspects, a lighting apparatus as described herein comprises multiple sets of solid state light emitters that are configured to be activated and/or deactivated at different times relative to one another during a portion of an AC cycle, and the lighting apparatus comprises an output of at least approximately 100 lumens per watt (LPW) or more, least about 120 LPW or more, at least approximately 130 LPW or more, at least approximately 140 LPW or more, or more than approximately 150 LPW. One or more of the foregoing LPW thresholds are attained for emissions having at least one of a cool white (CW) color temperature or a warm white (WW) color temperature. White emissions of apparatuses herein have x, y color coordinates within four, seven, or ten MacAdam step ellipses of a reference point on the blackbody locus of a 1931 CIE Chromaticity Diagram. Apparatuses described herein can be powered via approximately 10 watts (W) or more.

In some aspects, apparatuses described herein can emit white light having a reference point on the blackbody locus (e.g., 1931 CIE Chromaticity Diagram) can have a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from a lighting apparatus as described herein embody a color rendering index (CRI Ra) value of at least 70, at least 75, or at least 80 (e.g., 82 or 85) or more.

In some aspects, LED segments are positioned sequentially according to an increasing or decreasing color temperature, or CCT, across the apparatus. Such placement can be beneficial to improve dimming, and/or can be beneficial for managing heat dissipation from a lighting apparatus.

Various illustrative features are described below in connection with the accompanying figures.

FIG. 1 is a schematic block diagram illustrating a solid state lighting apparatus, generally designated 10, according to some aspects of the present subject matter. Solid state lighting apparatus 10 can comprise direct drive control circuitry 12 coupled to one or more LED segments, generally designated 14. Direct drive control circuitry 12 and LED segments 14 can each be mounted, arranged, and/or otherwise supported over one or more surfaces of a substrate 16. The term "mounted on" as used herein comprises configurations where the component, such as an LED chip or submount of a LED package, can be physically and/or electrically connected to a portion of substrate 16 via an attachment agent or adhesive agent such as solder (metal or metal alloy), epoxy, silicone, adhesive, glue, paste, combinations thereof and/or any other suitable attachment material and/or method. Various components or elements are described as being "mounted on" substrate 16 and can be disposed on the same surface of the same substrate 16, on opposing surfaces of the same substrate 16, or on adjacent surfaces of the same substrate 16. For example, components that are placed and soldered on the same substrate during assembly can be described as being "mounted on" that substrate.

Figure 3:
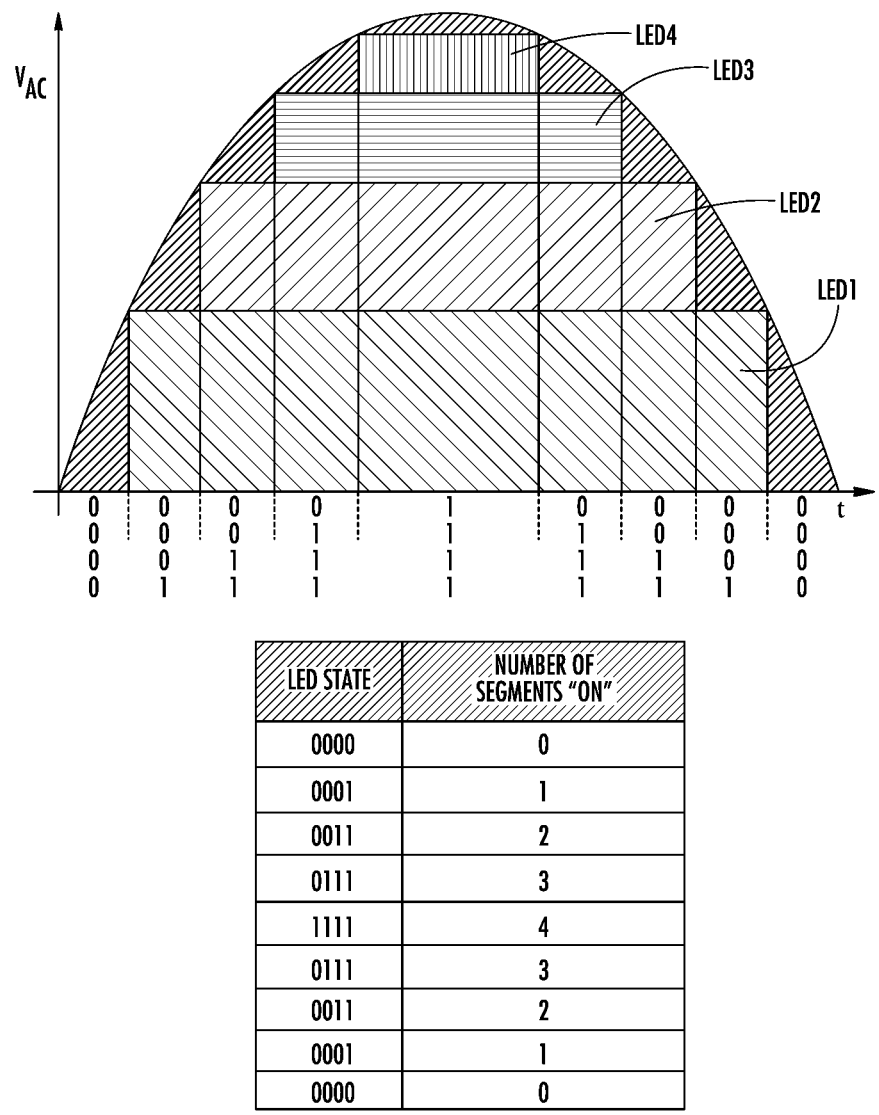
FIG. 3 is a plot of voltage versus time of a rectified AC waveform having a superimposed plot and table illustrating activation and deactivation times for four LED segments according to some aspects.

An electrical AC power source can provide an alternating electrical signal (current and voltage) to apparatus 10. In some aspects, AC power is directly provided to a rectifier circuit, such as a diode bridge 18, of apparatus 10. Diode bridge 18 can also be disposed over and/or mounted on substrate 16 for providing rectified AC power directly to direct drive control circuitry 12 for driving LED segments 14 via a rectified (positive waveform), thereby reducing perceptible flicker, for example, during dimming or otherwise switching current through LED segments 14. Control circuitry 12 is adapted to switch current through LED segments 14, for example, by pushing more current into some segments and/or bypassing other segments. In other aspects, control circuitry 12 can supply different, variable amounts of current to each segment 14. In some aspects, circuitry 12 can be adapted to activate and/or deactivate different LED segments 14 of multiple segments, during different portions of an AC waveform as described with respect to FIG. 3 provided hereinbelow.

In some aspect, device 10 comprises a receiver supported by or on substrate 16. The receiver can comprise a circuit or circuit component (e.g., a portion of circuitry 12, 18, and/or a driver component 22) that is adapted to receive alternating current (AC) directly from a rectified AC power source. The receiver can receive and direct current to one or more LED segments. In some aspects, the receiver comprises a connector (e.g., C, FIG. 5) which receives power directly from the AC power source. The current is then rectified and passed into the LED chips.

In some aspects, LED segments 14 comprise mutually exclusive and separately switchable LED segments identified as "LED1" to "LEDn", (where "n" is a whole number integer greater than 1). Segments 14 can be electrically coupled in series with one another, or in parallel with one another, or in combinations thereof. Each segment 14 can comprise at least two LED chips serially connected to each other via direct drive control circuitry 12. In some aspects, each segment 14 can comprise at least one high voltage LED chip (e.g., 12 V, 14 V, etc.) in which a series of junctions are connected on a single LED chip. In some aspects, each segment 14 comprises a plurality of LED chips, such as more than one LED chip, more than four LED chips, more than 6 LED chips, or more than 10 LED chips. In some aspects, each LED segment 14 is configured to emit light having a particular, targeted CCT value. In some aspects, at least one targeted LED segment 14 is configured to shift the characteristic of the light generated by apparatus 10 from any full targeted spectral power distribution to, for example, a targeted spectral power distribution, as dimming proceeds. In some aspects, the targeted spectral power distribution can be provided using LED chips in the targeted segment that have particular CRI values, CCT values, efficacy values, S/P ratios (i.e., scotopic to photopic ratios), or any other lighting characteristic that is intended to be specified as a target light for dimming. In further aspects, the targeted spectral power distribution can be provided using LED chips, which are all at or near the same color point (e.g., CCT) at any dimming level.

Direct drive control circuitry 12 can comprise a packaged or housed integrated circuit component, such as a power or driver chip, configured to supply electrical current to each LED segment 14. Each LED segment 14 can receive a same amount of electrical current or different amounts of electrical current at various times via direct drive control circuitry 12 for achieving a desired amount of illumination, color, and/or color temperature from each of the plurality of LED segments 14. In some aspects, direct drive control circuitry 12 supplies current to some LED segments 14 and does not supply current to other LED segments 14, such that some segments may remain dark or "off". In some aspects, each LED segment 14 is individually controlled for providing any illumination level and/or color temperature between a fully "on" state and any dimmed state that is below the fully "on" state.

In some aspects, direct drive control circuitry 12 comprises an integrated circuit (IC) package mounted on substrate 16 for receiving a direct, rectified AC signal and controlling current supplied to a plurality of LED segments 14. Direct drive control circuitry 12 can control an amount of electrical current collectively and/or individually supplied to LED segments 14 in response to a change in line voltage, a control signal, an input, or any other control parameter. For example, direct drive control circuitry 12 can supply current collectively and/or individually to one or more LED segments 14 in response to activation or physical movement of a dimmer switch, a pre-set condition, a user-defined condition, one or more inputs or other control parameters, any perceptible change in line voltage, or a sensor arranged to sense or detect electrical, optical, environmental and/or thermal properties, such as 10 V dimming, which is a common standard for industrial components.

Notably and in some aspects, direct drive control circuitry 12 can comprise what is referred to as a "smart" driver/power chip. The driver chip is configured to monitor the input voltage and determine at what times or portions of a rectified AC waveform LED segments 14 should be switched "on" and "off". Direct drive control circuitry 12 can comprise a sensor or comparator circuit 20 configured to monitor the power or input voltage via monitoring the AC line in, and determine when to supply current to, change an amount of current supplied to, bypass current to, and/or switch on/off the one or more LED segments 14. In some aspects, direct drive control circuitry 12 can comprise a control circuit adapted to issue control commands (e.g., such as 10 V dimming) for activating and/or deactivating LED segments 14 in response to processing the monitored changes of input voltage.

In some aspects, direct drive control circuitry 12 comprises a flat no-lead IC package, for example, a quad-flat no-lead (QFN) surface mount package, a dual-flat no-lead (DFN) surface mount package, and/or a micro leadframe package (MLP). Such packages are configured to physically and electrically connect to portions of substrate 16 via electrically conductive members, portions, and/or surfaces of circuitry 12, such as exposed metallic leads. Flat no-lead packages refer to packages having leadframe substrates, however, the "leads" are not externally extending from lateral sides of the package, for example, in a J-bend or gull-wing type configuration. Rather, circuitry 12 can comprise a near chip sized package having a planar copper lead frame substrate encapsulated in plastic. Perimeter leads on a bottom surface of the encapsulated package provide a direct electrical connection between circuitry 12 and other electrical components provided on or over substrate 16 such as diode bridge 18. In some aspects, direct drive control circuitry 12 further comprises an exposed thermal pad for improving heat transfer out of the chip and into substrate 16. In some aspects, one or more through holes or "vias" can be provided in the substrate 16 below the thermal pad (e.g., FIGS. 6A to 6D) for improving thermal management within apparatus 10.

LED segments 14 can comprise at least one LED chip or a plurality of LED chips coupled in series, parallel, and/or combinations thereof. In some aspects, multiple LED segments 14 are coupled in series or parallel between direct drive control circuitry 12. As described further below with respect to FIGS. 6A to 6G, one or more portions of direct drive control circuitry 12 can be at least partially coated with a reflective coating and/or be disposed below or within a portion of a reflective structure for reducing or eliminating impingement of light generated by LED chips within LED segments 14 onto components of driver circuit 12.

In some aspects, each LED segment 14 can be configured to emit light from apparatus 10 simultaneously at same portions of an AC waveform and/or at different times during different portions of an AC waveform. In some aspects, LED segments 14 are separately or individually controllable relative to each other via direct drive control circuitry 12. In some aspects, LED segments 14 comprise a multi-dimensional (e.g., two-dimensional) array of LED chips. LED segments 14 can comprise mutually exclusive groups or sets of LED chips. In one aspect, apparatus 10 comprises an array of multiple LED chips arranged in at least two mutually exclusive LED segments 14 of multiple LED chips, at least four mutually exclusive segments of multiple LED chips, at least six mutually exclusive segments of LED chips, or in more than six mutually exclusive segments of multiple LED chips.

It is appreciated that various aspects described herein can make use of the direct application of AC power to apparatus 10 (e.g., from an outside power source, not shown) without the inclusion of an AC-to-DC converter such as a switched mode power supply or a linear power supply. That is, various aspects relate to apparatuses that are devoid of a discrete AC-to-DC converter in electrical communication between the AC power source (e.g., identified as the "AC line in" in FIG. 1) and the multiple groups or segments of LED chips. In some aspects, diode bridge 18 receives power from the AC line and outputs rectified electrical current directly to control circuitry 12 and LED segments 14 for generating acceptable light output from apparatus 10. Diode bridge 18 can also be provided over or supported by substrate 16. Solid state lighting apparatus 10 can be utilized in light bulbs, lighting devices, lighting products, lighting components and/or lighting fixtures of any suitable type, such as, for example and without limitation, the lighting device illustrated in FIG. 9.

In some aspects, apparatus 10 is devoid of one or more discrete energy storage devices disposed over substrate 16, such as one or more discrete electrolytic capacitors or inductors. Notably, direct drive control circuitry 12 can integrate storage and/or current diversion circuitry into a single package or power/driver chip. For example, direct drive control circuitry 12 can comprise an IC package or chip which obviates the need for discrete capacitors and/or inductors. This can advantageously increase the amount of space over substrate 16 available for LED chips (e.g., thereby increasing brightness) and decrease the cost associated with manufacturing apparatus 10. In addition to these benefits, apparatuses that are devoid of one or more electrolytic capacitors benefit from an increased lifetime (e.g., as capacitors are typically a lifetime-limiting component), as well as allowing smaller sizes to accommodate a given brightness level.

As FIG. 1 further illustrates, LED segments 14 can accommodate any desired voltage level and different voltage levels for different applications. For illustration purposes, apparatus 10 is illustrated as being operable at both 120V and 240V. LED segments 14 are configured to be activated and/or deactivated at different times relative to one another during a portion of an AC cycle, and are configured to operate within about 3 percent or more of a root mean square (RMS) voltage of the AC power source (e.g., "AC line in"). In certain aspects, the AC power source has a nominal RMS voltage of at least about 100V, such as including approximate values of 90V, 110V, 120V, 170V, 220V, 230V, 240V, 277V, 300V, 480V, 600V higher voltages, or any approximate or subset of voltage as previously recited. Each LED segment 14 of apparatus 10 can be operable at any voltage level, and can be operable at a same or different voltage levels. In some aspects, the voltage at which the collective LED segments 14 operate can add up or sum to the line voltage.

For example and in one aspect, apparatus 10 can be operable at an AC line voltage or input voltage of approximately 120V. In this aspect, four LED segments 14 can be provided. Each LED segment 14 can be operable at approximately 30V. In other aspects, each LED segment 14 can be operable at different voltages, the sum of which equals the line voltage of approximately 120V. Any number of LED segments 14 can be provided, where each segment is comprised of any number of serially connected LED chips. Sensor/comparator circuitry 20 can monitor the line voltage and determine when to switch LED segments 14 on/off as depicted in FIG. 3.

In another aspect, apparatus 10 can be operable at an AC line voltage or input voltage of approximately 240V. In this aspect, six LED segments 14 can be provided. Each LED segment 14 can be operable at approximately 40V. In other aspects, each LED segment 14 can be operable at different or variable voltages, the sum of which equals the line voltage of approximately 240V. Any number of LED segments 14 can be provided, where each segment is comprised of any number of serially connected LED chips.

Figure 2:
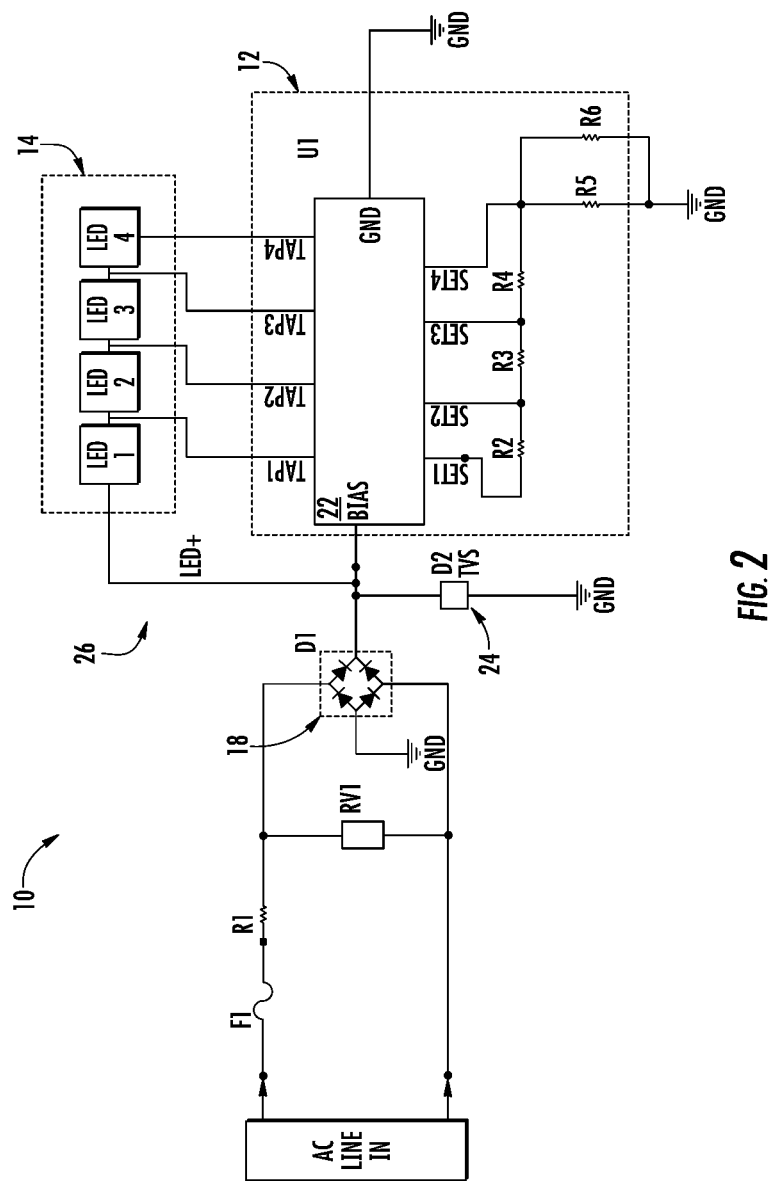
FIG. 2 is a schematic circuit diagram illustrating the direct drive control circuitry as shown in FIG. 1 and LED segments coupled thereto according to some aspects.

FIG. 2 is a schematic circuit diagram of apparatus 10, which illustrates in more detail at least some of the circuitry, associated with direct drive control circuitry 12, diode bridge 18, and/or LED segments 14 described in FIG. 1, according to some aspects. As FIG. 2 illustrates, power can be received from an AC power source (e.g., indicated as "AC line in"). AC current can flow directly into apparatus 10 and across one or more microelectronic devices such as a first fuse, designated F1, and a first resistor, designated R1, prior to entering diode bridge 18. A surge protection element or surge protection circuitry, designated RV1, can be provided in parallel with respect to diode bridge 18. Surge protection circuitry RV1 can comprise a microelectronic device arranged on or over the substrate (e.g., 16, FIG. 1) for reducing or eliminating transmission of voltage transients exceeding the line voltage provided to the LED segments 14. Another surge protection device, such as a TVS diode array 24 can be provided prior to current reaching LED segments 14 for protecting LED chips from voltage spikes.

Diode bridge 18 can be configured to pass current directly to direct drive control circuitry 12. Direct drive control circuitry 12 can comprise a driver chip 22 including a sensor or comparator circuit for monitoring the line voltage (e.g., 20, FIG. 1) and supplying current to LED segments 14. As noted above, direct drive control circuitry can be mounted on substrate 16 as a bare die, wirebonded to the traces and encapsulated and/or housed within a single IC package such as a QFN package, a DFN package, or a MLP. Driver chip 22 can comprise one or more input or set lines, generally designated SET1, SET2, SET3, SET4, etc., in addition to one or more output or tap lines, generally designated TAP1, TAP2, TAP3, TAP4, etc. The plurality of set lines can be configured to control an amount of current that is routed or pushed into each LED segment 14 via respective tap lines and/or the times or voltages when each segment is turned on/off. Set and tap lines are also configured to bypass some LED segments 14 while supplying current and thereby activating other LED segments 14. The plurality of tap lines can be configured to pass current directly into respective LED segments 14. In some aspects, an amount of current supplied to each LED segment 14 can be selectively controlled for producing any desired illumination and/or color point. Notably, each LED segment 14 can be mutually exclusive from each other LED segment, allowing for individualized control thereof. Although only four separate LED segments 14 are shown for illustration purposes (i.e., LED1, LED2, LED3, LED4) in FIG. 2, more or less than four LED segments 14 can be provided per apparatus 10.

At least one electrostatic discharge (ESD) protection device (not shown) can be provided per apparatus 10, and reverse biased with respect to each LED segment 14. ESD protection device can be configured to protect LED chips within each LED segment 14 from damage, due to an ESD event.

In some aspects, each LED segment 14 is separately switchable "on" or "off" during different portions of a rectified AC waveform at any voltage. For example, a first segment LED1, a second segment LED2, a third segment LED3, and a fourth segment LED4 can be configured for inclusion in the lighting apparatus operating from a 120V power source. As discussed above, apparatus 10 is operable at any desired voltage for accommodating desired relatively higher and/or lower voltage applications (e.g., 120V applications, 240V applications, more than 240V lighting applications).

Notably, each LED segment 14 can be configured to emit a different CCT color temperature for improved dimming. Each LED chip within each respective segment can target approximately a same CCT value. For example, and in some aspects, first segment LED1 can be configured to emit light comprising a CCT value targeting approximately 1800K. Second and third segments LED2 and LED3 can be configured to emit slightly cooler light, for example, comprising CCT values targeting approximately 2100K and 2400K, respectively. Fourth segment LED4 is configured to emit slightly cooler light targeting approximately 3000K. Where apparatus 10 targets approximately 3000K, fourth segment LED4 can be configured to emit light targeting more than approximately 3000K. When each segment is powered "on", together the four segments LED1, LED2, LED3, and LED4 are collectively configured to emit warm white light that is tuned or targeted to approximately 2700K and/or approximately 3000K. As each segment, turns from "on" to "off" light warms from approximately 2700K (e.g., or 3000K) to 1800K as it dims, halogen-style. Thus, apparatus 10 emits light that is pleasing to consumers, and perceptible flicker during dimming is reduced via electrical components supported over substrate 16.

In some aspects, LED chips within each LED segment target a same or approximately a same CCT value. That is, first segment LED1 can comprise multiple serially connected LED chips, where each intra-string chip comprises a CCT value of approximately 1800K. Similarly, second, third, and fourth segments LED2, LED3, and LED4, respectively, comprise intra-string chips having CCT values targeting approximately 2100K, 2400K, and 3000K, respectively.

FIG. 3 is a plot of rectified line voltage ($V_{AC}$) versus time (t), wherein a superimposed plot and table collectively illustrate activation and deactivation times for at least four LED segments according to some aspects herein. FIG. 3 illustrates selective switching of first segment LED1, second segment LED2, third segment LED3, and fourth segment LED4 as shown in FIGS. 1 and 2, as it can occur along a portion of a rectified AC power (e.g., a rectified AC waveform). Again and as noted hereinabove, more or less than four LED segments (e.g., strings of serially connected LED chips) can be provided per apparatus 10.

According to FIG. 3, a portion of the rectified AC power is annotated with indications of magnitude interval bits across the horizontal axis. As shown, the magnitude interval bits transition from a first state (0000) at approximately 0 VAC, up to a last state (1111) at a peak voltage (e.g., at the apex of the AC waveform) and then transition back down again to the first state (0000). The magnitude interval bits can, but do not have to, indicate a magnitude of the rectified AC power at which the LED segments (e.g., 14, FIGS. 1 and 2) can be selectively switched "on" and "off" for providing a desired color temperature during the different intervals of the rectified AC power cycle. Again, as long as the voltage of the collective LED segments 14 sums to less than or near the line voltage (including voltage drops across resistors, drivers and/or electrical components), LED segments 14 can be operable at and/or not limited to operation at any pre-defined forward voltage.

For illustration purposes only, FIG. 3 indicates four LED segments as being selectively switched on and off during the rectified AC power. However, more or less than four LED segments can be provided per apparatus and switched on/off as described herein. During some magnitude interval bits, at least one LED segment can be turned on/off, and current can bypass some of the other remaining LED segments. At interval (1111) however, all four LED segments are switched or powered on (e.g., activated).

For example, at (0001), a first segment LED1 is switched on, and each other LED segment is bypassed via direct drive control circuitry (e.g., 12, FIGS. 1 and 2). At (0011), second segment LED2 is switched on in addition to LED1, and current bypasses other segments. Direct drive circuitry 12 (FIGS. 1, 2) is adapted to monitor the line voltage and activate and/or deactivate LED segments. In some aspects, direct drive circuitry 12, at (0111) switches third segment LED3 on. At this point, current is only bypassing fourth segment LED4. At (1111), fourth segment LED4 is switched on, and all four segments are operable. When the light is dimmed, an increasing portion of the power from the rectified AC power to the LED segments is increasingly provided to the targeted segments (e.g., at the targeted color temperature or CCT value) so that the light generated shifts from the full spectral power distribution toward a targeted spectral power distribution that is pre-defined by the LED chips included in the targeted LED segment.

For example, and as discussed hereinabove, each segment can target a different color temperature. In some aspects, first segment LED1 can target approximately 1800K while LED4 can target approximately 2700K or 3000K. Direct drive control circuitry (12, FIGS. 1 and 2) is configured to control light output and/or color by switching LED segments on/off (i.e., activating/deactivating), and allocating power among the segments such that the light generated shifts from the full spectral power distribution toward a targeted spectral power distribution that is pre-defined by the LED chips included in the targeted LED segment. Where a targeted spectral power is that of first segment LED1 (e.g., approximately 1800K), more power will be allocated to that LED segment. Similarly, where a targeted spectral power is between or an average of first and second segments (e.g., around 2000K), then more power will be allocated to first and second segments, LED1 and LED2, respectively.

The circuit of FIG. 2 is subject to dimming during the AC waveform, and operates according to FIG. 3. An increasing portion of the power provided over the cycle is delivered to the targeted LED segments including those having the targeted spectral power distribution configured by the particular lighting characteristics as described herein. As a dimming phase angle decreases toward the low end of the range, an increasing portion of the power from the rectified AC voltage signal and/or AC power is provided to the targeted segment, which may provide the targeted spectral power distribution to which the light output shifts during dimming. For example, LED segments in the string can be configured such that non-targeted LED segments include relatively high CCT LEDs but with relatively high efficacy, whereas the targeted LED segment can include lower CCT LEDs but with relatively low efficacy. That is, as CCT decreases, so does efficacy. In response to dimming, the targeting spectral power distribution can be provided by the shift from relatively high lumen per watt output light with high efficacy to light that is relatively low efficacy but has higher CRI. Moreover, the shift toward the targeted spectral power distribution can be provided despite the fact that other lighting characteristics between the LED segments may be the same. For example and in some aspects, a targeted LED segment can include LED chips that are configured to generate light having a CRI of about 95 at low efficacy, whereas other LED segments can generate light having higher efficacy but at a CRI of about 75.

A particular light having a full spectral power distribution can be generated by the combination of all of the LED segments (i.e., LED1, LED2, LED3, and LED4) when the light is full on, for example. When the light is dimmed, however, an increasing portion of the power from the rectified AC power to the LED segments is increasingly provided to the targeted LED segment so that the light generated shifts from the full spectral power distribution toward a targeted spectral power distribution that is pre-defined by the LED chips included in the targeted LED segment. Accordingly, the targeted spectral power distribution can have different lighting characteristics than the full spectral power distribution provided by the combination of all LED segments. When each segment is activated or powered "on", together the four segments LED1, LED2, LED3, and LED4 can be collectively configured to emit a color temperature that is that tuned to approximately 2700K or approximately 3000K, and a light output of approximately 1000 lumens and approximately 100 LPW or more. As each segment, turns from "off" to "on" between (1111) to (0000), light warms from approximately 2700K (e.g., or about 3000K) to 1800K as it dims.

It will be understood that the control of the separately switchable LED segments may further be provided according to any method by which the timing or magnitude of the rectified AC power may be determined. For example, in some aspects according to the present subject matter, the switching may be provided using the techniques described in commonly assigned U.S. Pat. No. 8,476,836, the disclosure of which is incorporated herein by reference.

Still referring to FIG. 3 and in some aspects, driver chip 22 (FIG. 2) can activate/deactivate multiple LED segments 14 at specific times to coincide with the voltage waveform or a half wave rectified AC source. At low voltages, one string will turn on. As the voltage of the AC waveform increases, additional segments 14 can be activated. Each string can be configured to be in series to the first string. A total voltage of the LED strings (e.g., consisting of multiple segments 14) can match the have wave rectified voltage and continue to increase with the half wave rectified voltage level. This can be done by switching in more LED segments 14 to the string of segments. Once the half wave rectified signal reaches its peak, driver chip 22 (FIG. 2) will start to switch LED segments 14 off of the circuit or string to match the voltage of the half wave rectified source shown in FIG. 3. A dimmer can be used to cut the AC waveform at a particular phase. At low dimming ranges, only one of the LED strings 14 may be in the string circuit and producing light. Of course, FIG. 3 is a simple explanation and not always exact. For example, the voltage of the individual LED strings is not constant and increases with current. The stair-step voltage levels of FIG. 3 may actually be curves in practice.

In some aspects, segments LED1, LED2, LED3, and LED4 comprise similar, but different CCT values for dimming. This can provide a more consistent color production during dimming. Mixing different colored LED chips in each segment (e.g., LED1, LED2, LED3, and LED4) is also contemplated, as driver circuit 12 comprising driver chip 22 can allow for color change while dimming, and increase the CRI of the LED source.

Figure 4:
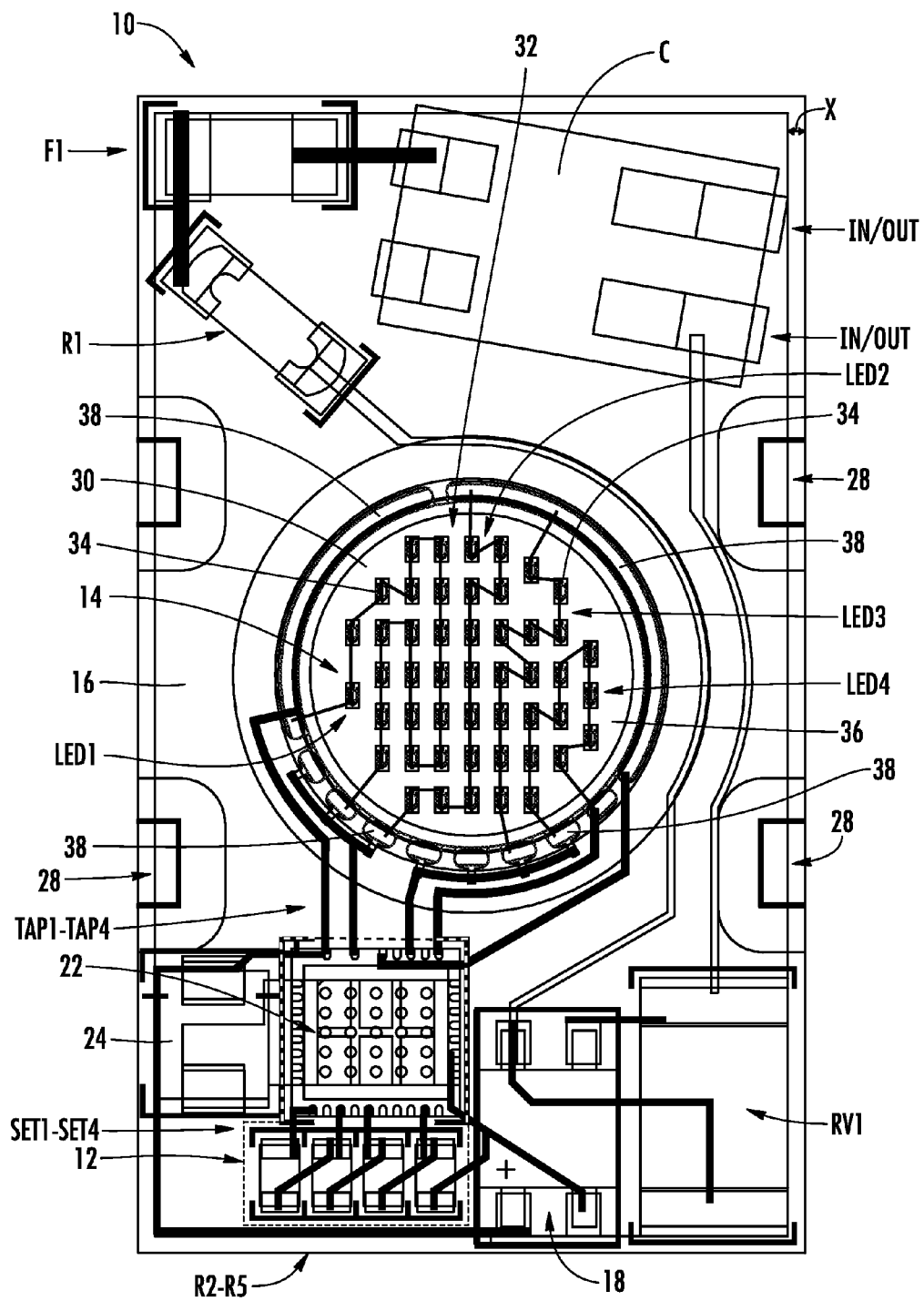
FIG. 4 is a top plan view illustrating a solid state lighting apparatus including multiple solid state light emitters and associated circuitry, on or over a substrate according to some aspects.

FIG. 4 is a schematic illustration of a top view of solid state lighting apparatus 10. Apparatus 10 can comprise a substantially rectangular substrate 16 over which a substantially circular light emission area having a substantially circular light emitter surface can be provided, for example, as discussed, in commonly assigned and co-pending U.S. Pat. No. 8,564,000, U.S. Pat. No. 8,624,271, and U.S. patent application Ser. No. 13/282,172, the disclosure of each of which is hereby incorporated by reference herein.

Referring in general to FIG. 4, apparatus 10 can comprise substrate 16 over which a light emission area generally designated 32, is provided and supported. Emission area 32 comprises one or more LED chips 34 provided over a mounting area 36. LED chips 34 can be provided in one or more mutually exclusive and separately switchable LED segments 14, individually and specifically designated LED1, LED2, LED3, and LED4. As noted hereinabove, more or less than four LED segments 14 can be provided per apparatus. FIG. 4 is illustrative of various electrical components, circuitry, and LED chips 34 prior to encapsulating or otherwise covering LED chips 34 with an optical element. Thus, some features shown in FIG. 4 may not be visible during use and/or operation of apparatus 10 (see e.g., FIG. 5 in which some traces, LED chips, and/or electrical connections between components and circuitry may not be visible in a final, fully manufactured form).

In some aspects, mounting area 36 can be disposed adjacent to and/or between one or more electrical components, such as electrical traces 38. Electrical traces 38 can comprise electrically conductive portions of material (e.g., Cu, Ag, Ti, Au, Pt, Sn, Ni, Pd, HASL or any metal or metal alloy), of opposing polarity for passing current through LED segments 14. As FIG. 4 illustrates, traces can be arranged in a substantially annular or circular pattern. LED segments 14 can comprise an array of LED chips that are switchable on/off at different times during an AC waveform by virtue of connection to different tap lines (e.g., TAP1 to TAP4) of driver chip 22. Driver chip 22 can selectively supply current to different tap lines (e.g., TAP1 to TAP4) for selectively supplying current to different LED segments 14 according to variations in line voltage. As noted above set lines, driver chip 22 can comprise multiple input circuits or lines (e.g., SET1, SET2, SET3, SET4) in addition to one or more output circuits or lines (e.g., TAP1, TAP2, TAP3, TAP4, etc.) which can be configured to control an amount of current that is routed or pushed into respective LED segments 14.

One or more attachment areas 28 can be provided proximate one or more edges of substrate 16. Attachment areas 28 can comprise clamping pads and/or solder by which a lighting manufacturer may secure apparatus 10 within a given lighting fixture, bulb, or component. In some aspects, lighting designers or manufacturers prefer to clamp apparatuses into a given component. As such, substrate provides portions or areas 28 by which apparatus can be secured during operation.

In some aspects, portions of mounting area 36 and electrical traces 38 can be covered by a dam or reflective retaining member or structure (e.g., 42, FIG. 5) to reduce loss of light and to prevent corrosion or other degradation thereof. Mounting area 36 can be electrically conductive for supporting horizontally structured LED chips 34 (e.g., having bond pads of opposing electrical polarity disposed on a bottom surface of each LED chip) and/or vertically structured LED chips 34. In some aspects, mounting area 36 is non-conductive. LED chips 34 can comprise horizontally structured LED chips having bond pads of opposing electrical polarity disposed on a top surface thereof. Any type, size, structure, build, shape, and/or color of LED chips 34 can be used.

Notably, substrate 16 is configured to support one more LED chips 34 as well as multiple electrical components and/or circuitry. For example, substrate 16 supports an electrical connector C disposed thereon. In some aspects, connector C can be skewed, angled and/or otherwise offset with respect to a horizontal line and/or at least one edge of substrate 16. In other aspects, connector C can be substantially horizontally aligned and/or substantially parallel with at least one edge of substrate 16. Connector C can comprise one or more openings in which input wires carrying AC power can be received and directly connected. As indicated by the arrows depicting "IN/OUT", wires from an AC power source can directly connect with apparatus 10 via connector C.

AC current can flow directly into apparatus 10 for driving LED segments 14. Current can be directed across a first fuse F1 and a first resistor designated R1 prior entering diode bridge 18, each of which is supported via a single, common substrate 16. Diode bridge 18 can rectify the AC power for providing a rectified AC waveform (e.g. FIG. 3). In the event of a surge (high voltage) pulse beyond normal operating conditions, a portion of the current can be routed to surge protection component RV1. This is intended to protect the integrity and function of LED chips within segments 14 and other components, which are not designed to withstand such events. In some aspects, surge protection circuitry 24 can be provided in parallel with respect with diode bridge 18. Surge protection circuitry RV1 can reduce or eliminate transmission of voltage transients exceeding the acceptable voltage range of the LED segments 14. A TVS diode array 24 can also be provided for further protection of the LED chips 34 and/or driver chip 22 from voltage spikes.

In some aspects, substrate 16 comprises a ceramic based substrate, for example, alumina ($Al_2O_3$), high reflectivity alumina, or any other suitable ceramic or ceramic based material. In other aspects, substrate 16 comprises multiple layers of material, where at least one layer is a ceramic or a dielectric base layer. Substrate 16 can comprise any suitable material, such as ceramic, Al, Ti, Ag, Sn, Cu, alloys thereof, MIRO® manufactured by ALANOD®, etc., having one or more layers, such as traces provide thereon. In some aspects, substrate 16 comprises a PCB, a MCPCB, a laminate structure having one or more layers connected via adhesive, a flexible printed circuit board ("flextape" PCB) comprising a polymer-like film having at least one conductive layer within one or more layers of a flexible plastic resin (e.g., polyimide, Kapton from DuPont), and one or more adhesive layers comprising a tape-like adhesive provided on the flextape for easy connection to a ceramic body. In some aspects, substrate 16 can comprise a ceramic base having one or more (e.g., and optionally flexible) layers adhered thereon as discussed, for example, in commonly assigned and co-pending U.S. patent application Ser. No. 13/836,709 and U.S. patent application Ser. No. 13/836,940, the disclosure of each of which is hereby incorporated by reference herein. Sectional views of substrate 16 are shown and described in more detail in FIGS. 6A to 6G hereinbelow.

The layout or design of apparatus 10 can vary and/or become selectively changed for maximizing space over substrate 16. Maximizing space can allow lighting designers to increase or decrease a size or diameter of light emission area 32, for changing optical properties, such as brightness. In some aspects, each electrical component, for example, fuses, resistors, diodes (e.g., bridge diode 18 and TVS diode array 24), traces, circuitry, surge protection circuitry 24, wires, and driver chip 22 are each spaced a distance, designated X inboard of each outermost edge of substrate 16. In some aspects, distance X comprises at least approximately 1.6 millimeters (mm) in compliance with Underwriters Laboratory (UL®) testing standards and/or for meeting UL® spacing requirements.

In some aspects, LED segments 14 can comprise a plurality of "chip-on-board" (COB) LED chips 34 electrically coupled or connected in series or parallel with one another and mounted on a portion of substrate 16. In some aspects, COB LED chips 34 can be mounted directly on portions of substrate 16 without the need for additional packaging. For example, in some aspects LED segments 14 can comprise serial arrangements of differently colored LED chips available from Cree, Inc. of Durham N.C. In some aspects, each LED segment 14 is serially connected to other segments via driver chip 22. In other aspects, each LED segment 14 is electrically connected in parallel with other segments via driver chip 22.

Notably, apparatus 10 can be directly coupled to an AC power source that provides a rectified AC voltage signal to LED segments 14 without the use of an on-board switched mode power supply and/or without electrolytic capacitors. COB LED chips 34 can be electrically connected in serial arrangements, parallel arrangements, or combinations thereof. High voltage (e.g., multi-junction) LED chips may also be used.

In some aspects, substrate 16 can be provided in any relatively compact form factor (e.g., square, rectangle, circular, non-square, non-circular, symmetrical and/or asymmetrical) considering at least four LED segments 14 can be provided thereon. For example, substrate 16 can comprise a rectangle of approximately 20 mm×40 mm, such as approximately 23.75 mm×41.25 mm. Light emission area 32 can comprise a light emitter surface (e.g., 44, FIG. 5) having a diameter of approximately 10 mm or more; approximately 12 mm or more; approximately 14 mm or more; approximately 25 mm or more; approximately 30 mm or more; approximately 40 mm or more; approximately 50 mm or more; and/or a diameter having any range between approximately 10 and 100 mm. In some aspects, apparatus 10 comprises a light emitter surface (e.g., 44, FIG. 5) of approximately 12 mm or 14 mm (+/−0.2 mm) in diameter as provided over an approximately 24 mm×41 mm rectangular board or substrate 16. However, larger light emitter surfaces and/or areas may be provided over larger substrates 16, where desired.

Further, the resulting board or substrate 16 with COB LED chips 34 comprised thereon and operated by the direct application of AC power (i.e., without an on-board switched mode power supply) can provide an efficient output apparatus 10 and/or 30 that can deliver approximately 100 LPW or more in select color temperatures, such as between approximately 1800K and 3000K (i.e., nominally 2700K). In some aspects, substrate 16 can comprise a form factor suitable for replacement of standard light bulbs, elongated fluorescent tube-type bulbs, or replacement of fluorescent light fixtures.

Still referring to FIG. 4 and in some aspects, LED segments 14 can comprise at least one segment having a targeted CCT value targeted for dimming. For example, in some aspects, at least one LED segment 14 (e.g., first segment LED1) is characterized as having a particular CCT value which is different from at least one other LED segment. In other aspects, at least one LED segment 14 (e.g., first segment LED1) is characterized as having a particular CCT value which is different from each other LED segment. Accordingly, as dimming proceeds, the light output from apparatus 10 shifts in CCT value according to the combination of each LED segment 14 toward a targeted CCT value, such as reversibly dimming between approximately 2700K and 1800K.

In some aspects, LED segments 14 can be sequentially arranged adjacent each other across a portion of emission area 32 in ascending order (as moving from right to left) or descending order (as moving from left to right) according to the respective CCT values of the segments. For example, in some aspects, first segment LED1 is characterized as having the lowest CCT value of all of the segments, whereas fourth segment LED4 is characterized as having the highest CCT value of all of the segments. Still further, second segment LED2 is characterized as having a CCT value that is greater than that of first segment LED1 but less than that third and fourth segments LED3 and LED4, respectively. Moving from left to right across emission area 32, first segment LED1 is provided furthest towards the left, and fourth segment LED4 is provided furthest towards the right. Thus, LED segments 14 can be sequentially arranged in descending and/or ascending order according to CCT values moving from left to right and/or up and down across emission area 32, depending upon where the viewer is looking with respect to apparatus 10.

Furthermore, emission area 32 can be configured so that the LED segments 14 are also sequentially arranged adjacent each other across a portion of emission area 32 in ascending order (as moving from right to left) or descending order (as moving from left to right) according to the respective forward bias voltages of the segments. For example, first segment LED1 can, but does not have to be configured with LED chips so that the forward bias voltage is about equal to 60 V, whereas second segment LED2 can be configured with LED chips so that the forward bias voltage thereof is about equal to 40 V, and second and third segments LED3 and LED4, respectively, can be configured with LED chips so that the forward bias voltage thereof is about equal to 10 V each. As noted hereinabove, the collective voltage of LED segments 14 sums to approximately the line voltage, which can vary typically around approximately 120 or 240 V.

Driver chip 22 can comprise a "smart" chip meaning it is adapted to monitor AC line voltage and selectively switch current to particular ones of the LED segments 14 based on the magnitude of the rectified AC power. It is understood that the indication of the magnitude intervals (e.g., 0000 to 1110 in FIG. 3) can be provided using any desired technique. Emission area 32 can comprise separately switched LED segments 14, each of which can have a respective CCT value. Further, the LED segment having the lowest forward voltage of all of the LED segments can be populated with LEDs of a particular minimum CCT value that is the target value for dimming. For example, in some aspects, emission area 32 can comprise four or more separately switched segments: one segment of a minimum CCT value of approximately 1800K, two segments of a medium CCT value (e.g., between approximately 2000K and 2700K), and one segment having a highest CCT value (e.g., between approximately 2700K and 3000K), such that the lowest CCT value is the intended minimum CCT value to be provided as the target for dimming. Collectively, at full power, apparatus 10 can be configured to emit a nominal CCT value of approximately 2700K to 3000K (e.g., a combination of each LED segment).

When dimming is applied via segmental bypassing and/or selective electrical current routing via driver chip 12, apparatus 10 is dimmed so that the emitted light may more closely approximates incandescent lighting when, for example, the minimum value CCT LED chips are "warm" in color such as that provided by LED chips having a CCT value of about 1800K or a ccx and ccy of about (0.55, 0.41).

Figure 5:
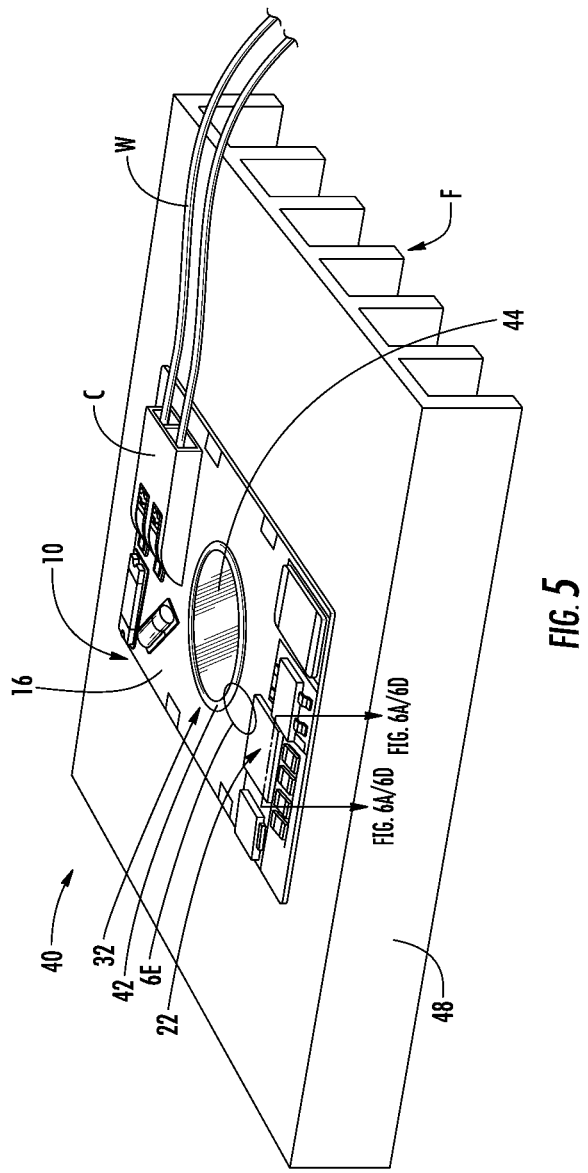
FIG. 5 is a perspective view illustrating a solid state lighting apparatus arranged on or over a heat sink of a lighting component or fixture according to some aspects.

Referring now to FIG. 5, a solid state lighting system, generally designated 40 is illustrated. In some aspects, system 40 includes apparatus 10 provided over and/or attached to a separate, external heat sink 48. Apparatus 10 can comprise a substantially circular shaped emission area 32 provided over substrate 16. One or more direct drive electrical components, such as power ship 22, can be provided over substrate 16 in addition to LED chips. Emission area includes LED segments or chips (e.g., 14 and 34, FIG. 4) provided within a portion of reflective retaining member 42, such as a wall, dam or dispensed retention material. Emission area 32 includes one or more LED segments (e.g., 14, FIG. 4) provided below an optical element 44. That is, in this view, LED segments (e.g., 14, FIG. 4) and underlying traces (e.g., 38, FIG. 4) which are visible in FIG. 4, are not visible in FIG. 5 as each can be provided below portions of optical element 44 and/or reflective retaining member 42. Notably, retaining member 42 can, but does not have to, comprise a phosphoric or lumiphoric material for further affecting or tuning light output.

In some aspects, optical element 44 comprises a layer of encapsulant dispensed over LED chips between portions of member 42. In other aspects, optical element 44 is molded over LED chips and retained via structure 32. Optical element 44 can comprise a silicone encapsulant having one or more luminescent materials, such as phosphor, provided therein. In some aspects optical element 44 can comprise a substantially yellow appearance because of the phosphoric material contained therein. In some aspects, more than one type of phosphor can be provided over LED chips. Optical element 44 can comprise any one of a yellow, green, blue, or red phosphor, and/or combinations thereof. Optical element 44 can comprise substantially uniform layers of phosphor, or non-uniform layers of phosphor. Optical element 44 can comprise a substantially planar light emitter surface from which light is emitted. Optical element 44 can comprise any suitable diameter, such as approximately 10 mm or more, 20 mm or more, 30 mm or more, 40 mm or more, 48 mm or more, or more than approximately 50 mm. Optical element 44 can comprise a light emitter surface that is approximately centered with respect to substrate 16. In some aspects, more than one light emission area 32 and, therefore, more than one optical element 44 or light emitter surface can be provide per apparatus. In other aspects, a non-centered optical element 44 (e.g., light emitter surface) or a non-centered emission area 32 can be provide over apparatus.

In some aspects, apparatus 10 can be electrically, thermally, and/or physically connected to heat sink 48 via adhesive. Heat sink 48 can comprise one or more fins, generally designated F, for assisting with heat dissipation and thermal management. In some aspects, system 40 may be provided within a lighting fixture, bulb, or component. Apparatus 10 can be configured to directly receive AC current via one or more electrical wires W, which electrically and/or physically connect AC power source to apparatus 10 via connector C.

In some aspects, systems 40 as described herein can deliver approximately 1000 lumens or more and have an efficiency ranging from between approximately 100 LPW and about 150 LPW at warm white temperatures of approximately 1800K to 3000K. In some aspects, systems 40 described herein can deliver more than approximately 500 lumens, more than approximately 1000 lumens, more than approximately 1200 lumens, more than approximately 1600 lumens, or more than approximately 2000 lumens. It will be understood that in some aspects, however, that greater output can be achieved by, for example, increasing the number of LED chips or by increasing the current signal or level used to drive the LED chips provided within apparatus 40. A greater output can also be achieved by, for example, incorporating reflective structures, reflective coatings, optical diffusers, remote phosphors, or wavelength conversion material (e.g., phosphor(s), lumiphors(s), etc.) over portions of each apparatus as described further below.

FIGS. 6A to 6G are sectional views of portions of system 40, along the lines indicated in FIG. 5. FIGS. 6A to 6G illustrate driver chip 22 (or a bare driver chip die 22' that is unpackaged) as provided over substrate 16. Notably, one or more through holes or "vias" can be provided in substrate 16 below portions of driver chip 22 for improving thermal management and improved heat dissipation within apparatus 10 and system 40. Improved thermal management also allows LED chips to run cooler, thereby providing brighter, more efficient apparatuses.

As FIGS. 6A to 6D illustrate, substrate 16 can comprise one or more layers of material. Each layer is optional, but aspects are shown and described herein for illustration purposes. In some aspects, substrate comprises a non-metallic base layer or body 62 over which an overlay 16A can be provided. Overlay 16A can comprise a PCB overlay, attached to the non-metallic (e.g., ceramic) base layer 62 via adhesive 60. Driver chip 22 can comprise one or more electrical leads 22A extending from a perimeter bottom surface thereof. Driver chip 22 can also comprise a thermal pad 22B extending from a bottom surface thereof. Electrical leads 22A and pad 22B can comprise an electrically and/or thermally conductive material, such as Cu, Ag, Au, Pt, Ti, Sn, and/or combinations thereof. By having leads 22A extend from a bottom surface of driver chip 22 (i.e., as opposed to extending from lateral sides of chip 22), electrical components over substrate 14 can be spaced closer together, allowing for larger emission areas 32, and brighter more efficient apparatuses and systems.

Referring to FIGS. 6A to 6D, substrate 16 can comprise a non-metallic body 62 having a substrate overlay 16A provided thereon. An upper surface of substrate 16 and overlay 16A can comprise a reflective coating 50, such as an optically reflective solder mask material. Coating 50 may be a white or shiny (high diffuse or specularly reflectivity) material for reflection of light. Electrical components, such as electrically conductive traces 52 can be provided between portions of solder mask 50, providing paths for electrical communication between various components of system 40. In some aspects, traces 52 electrically communicate with leads 22A and thermal pad 22B of driver chip 22, and supply current from an AC power source to driver chip 22. In some aspects, leads 22A and thermal pad 22B can be soldered to conductive traces 52 of substrate 16. Conductive traces 52 can extend between various electrical components and/or LED chips supported over substrate 16 for facilitating electrical communication within apparatus 10 and/or system 40. In some aspects, at least one electrical component or trace 52 is spaced apart from the non-metallic body 62 by one or more non-metallic layers, such as a dielectric layer or material 56. Dielectric material can comprise any suitable material, such as a plastic, glass, oxide layer, FR-4, fiberglass reinforced epoxy, polyimide, or any PCB laminate used in the industry.

In some aspects, electrically conductive vias 54 can be disposed within portions of substrate 16, for example, within a portion of dielectric material 56, along an interior width thereof for electrically connecting one or more components. Electrically conductive vias 54 can be provided below driver chip 22 within a portion of dielectric material 56. Although not shown, vias 54 may also be provided below emission area 32 for improving heat dissipation from LED chips 34. Vias 54 can be provided at any suitable location within portions of substrate 16, including substrates overlay 16A. Electrically conductive vias 54 can provide electrical and thermal communication between driver chip 22 and a second, lower trace layer 58 of substrate 16. An optional layer of adhesive 60 can connect portions of a dielectric material 56 and to the core layer (e.g., base layer) or non-metallic body 62 of substrate. Body 62 can comprise a ceramic substrate, or other reflective and high thermal resistance material such as aluminum, coated aluminum, or anodized aluminum. Body 62 of substrate 16 can physically, electrically, and/or thermally connect with heat sink 48 via a thermal interface material (TIM) 64. TIM 64 is optional, and can comprise arctic silver, or any other suitable thermal adhesive, thermal grease, or thermal pad.

In general, FIGS. 6A to 6E illustrate substrate 16 comprising a non-metallic body 62 having a first surface. One or more electrical components (e.g., traces 52) can be disposed over and/or supported on the first surface of substrate 16. At least one electrical component, such as first trace 52, is spaced from the non-metallic body 62 by one or more non-metallic layers, such as dielectric material 56. Driver chip 22 and/or an array of solid state light emitters (e.g., LED chips) can also be supported by the first surface of substrate 16 and electrically coupled to the one or more electrical components thereof (e.g., traces 52).

Figure 6A:
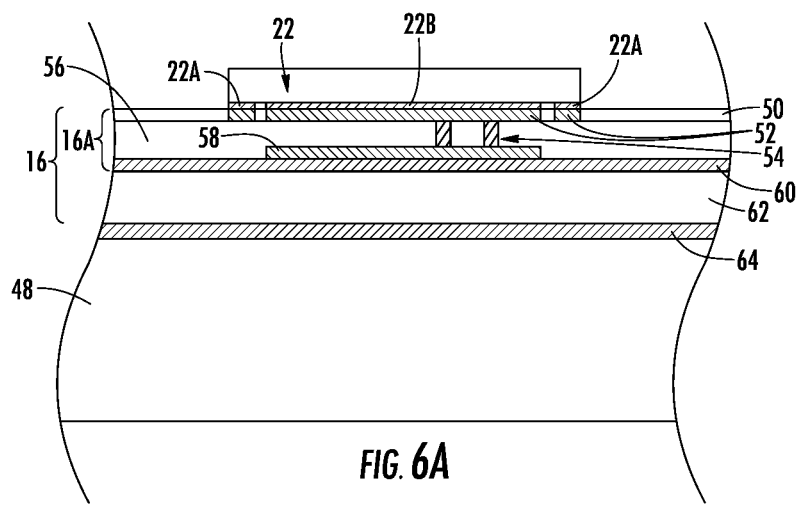
FIGS. 6A to 6G are sectional views illustrating portions of the solid state lighting apparatus of FIG. 5 according to some aspects.
Figure 6B:
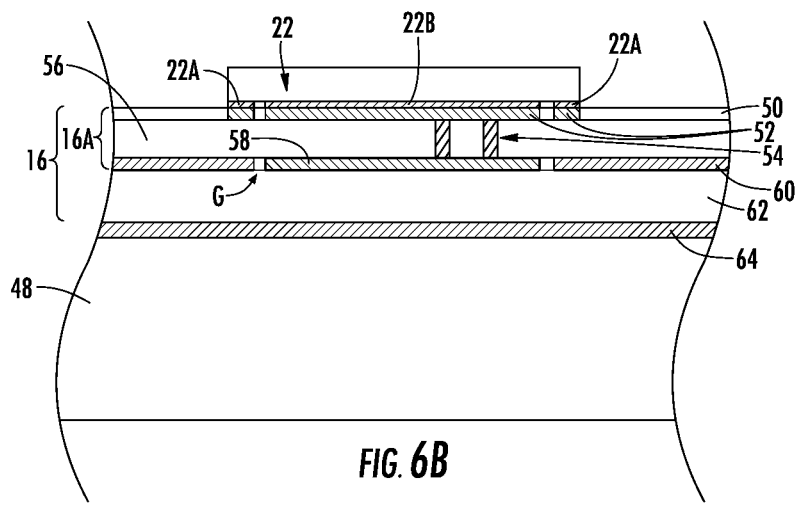

Referring to FIG. 6B, in some aspects, adhesive 60 can comprise one or more openings and/or voids configured to receive lower trace layer 58. For example, as FIG. 6B illustrates, in some aspects at least one electrical component (e.g., lower trace layer 58) can be disposed between one or more portions of adhesive 60 or an adhesive layer, such that lower trace layer 58 can directly attach to the non-metallic body 62 for improving heat dissipation and thermal properties within apparatus. In some aspects, lower trace layer 58 is disposed along a same plane as adhesive 60. Lower trace layer 58 can abut portions of adhesive 60, or in other aspects, one or more gaps G can be provided therebetween.

Figure 6C:
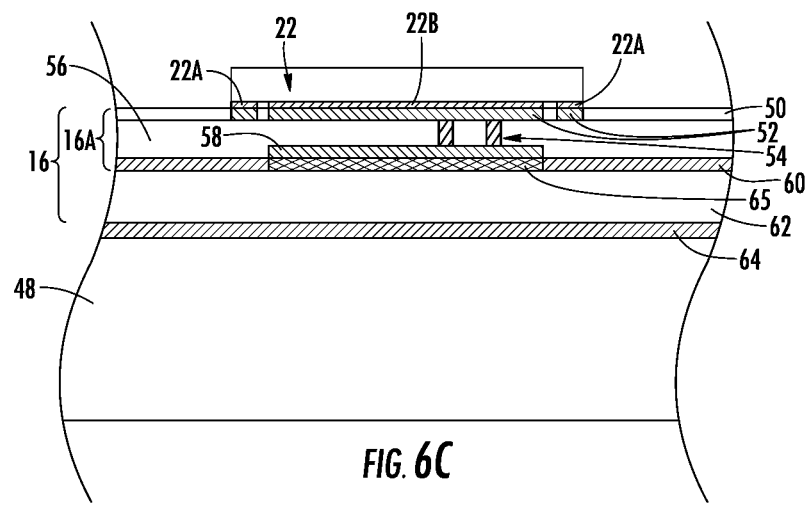

Referring now to FIG. 6C, in some aspects, a layer of a thermally conductive material 65 can be provided below trace layer 56 and disposed between portions of adhesive layer 60. Material 65 can also be disposed between trace layer 56 and body 62 for improving heat dissipation and thermal management within apparatus. That is, in some aspects adhesive layer 60 can be used for strong bonding between overlay 16A and body 62 of substrate 16, however, the adhesive may not conduct heat efficiently. Thus, thermally conductive material 65 can be used for improving thermal management within apparatus, thereby improving efficiency of apparatus. Material 65 can comprise any material capable of conducting heat, such as a thermal adhesive, a thermal epoxy, solder, a thermal paste, a metal, a metal alloy, or a ceramic-filled compound.

Figure 6D:
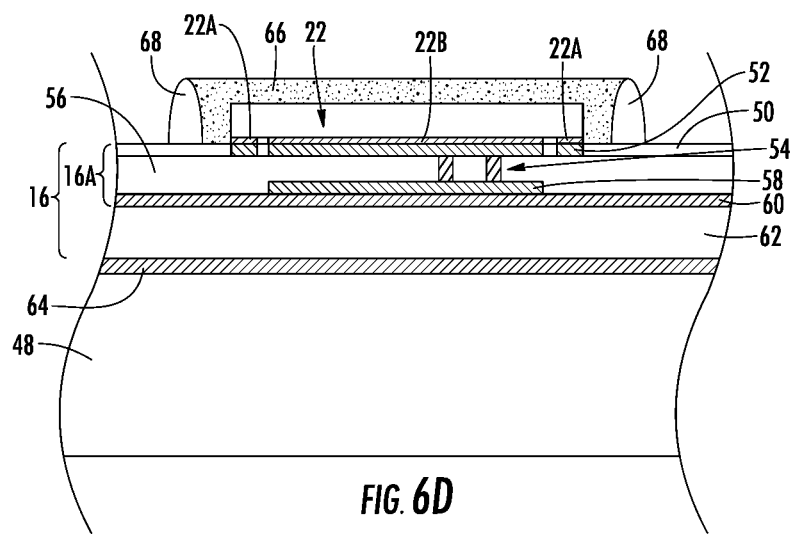

As FIGS. 6A to 6C illustrate, driver chip 12 can be left exposed over an upper surface of substrate 16. In other aspects, as FIG. 6D illustrates, driver chip 22 can be covered and/or encapsulated with a reflective coating 66 and/or reflective structure. Reflective coating 66 can advantageously increase an amount of light reflected from apparatus 10 and/or system 40, thereby improving efficiency and optical properties thereof. Reflective coating 66 is optional, and may optionally be retained via a retaining structure 68, such as a reflective wall, dam, or dispensed retaining structured. In some aspects, reflective coating 66 reduces an amount of light impinging upon electrical components, such as driver chip 22.

Figure 6E:
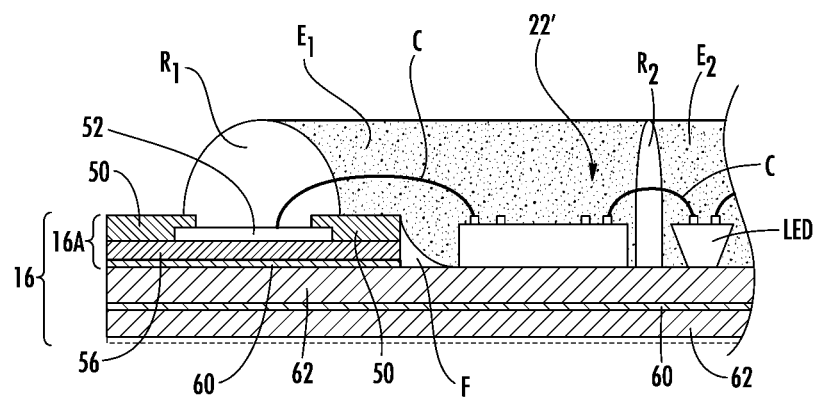

FIG. 6E is a sectional view of a driver chip or bare die 22' adjacent a light emission area 32 as indicated in FIG. 5, according to another aspect. As FIG. 6E illustrates, substrate 16 can comprise one or more alternating layers of a non-metallic body 62 and adhesive 60, over which overlay 16A can be provided. Overlay 16A can comprise dielectric material 56 and coating 50 (e.g., solder mask, white reflective structure, or material) secured to a non-metallic body 62 via adhesive 60. In this embodiment, die 22' and solid state light emitter, such as an LED chip (depicted as "LED") can be provided directly over a first surface of body 62 being attached with an appropriate adhesive. This can improve heat dissipation within device, which allows die 22' and LED chips to run cooler, and more efficiently.

In this aspect, die 22' can comprise a packaged or unpackaged IC device having contacts on a top surface thereof for connecting to LED chips (e.g., LED) via electrical connectors C, such as wire bonds. Die 22' can also connect with electrical trace 52 via a connector C. Similar to FIG. 6D, in this aspect, die 22' can be coated or encapsulated with a reflective material for reducing blockage or absorption of light.

In some aspects, die 22' and LED are each coated with a same material, such as silicone. In other aspects, die 22' can be encapsulated by a first material $E_1$ and LED can be encapsulated with a second, different material $E_2$. First material $E_1$ can comprise a white, opaque, and/or reflective coating structure or material for completely covering die 22'. Second material $E_2$ can comprise a silicone encapsulation with one or more optional phosphors provided therein. In some aspects, first material $E_1$ can be retained and/or bounded by a first retention material $R_1$ and second material $E_2$ can be retained and/or bounded by a second retention material $R_2$. Retention materials $R_1$ and $R_2$ can comprise any reflective structure, such as a molded or dispensed and cured structure. Connectors C can extend within retention materials $R_1$ and $R_2$ for facilitating electrical connection between components.

An optional fillet F (e.g., a curved or planed structure) can be provided between driver chip and overlay 16A for reducing bubbles $E_1$ within first material and/or for improving reflection within the LED area. LED and die 22' can directly attach to body 62 via paste, epoxy, silicone, or adhesive.

Figure 6F:
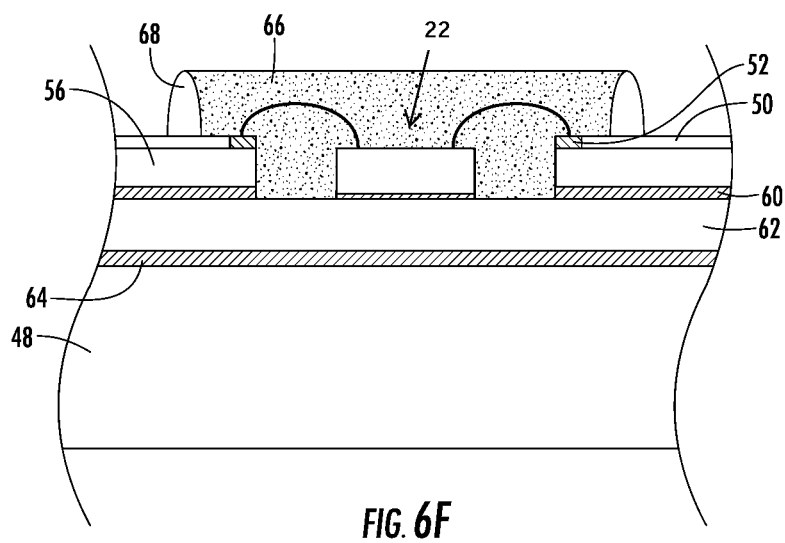

Referring now to FIG. 6F and in some aspects, the driver component can comprise a bare (e.g., unpackaged) die 22', similar to FIG. 6E. In this embodiment, however, die 22' may not be directly adjacent to the LED chips. Die 22' and LED chips can each wirebond to traces 52 for eliminating long wirebonds. Die 22' can be attached to base material 62 via a die attach adhesive (e.g., solder, epoxy, flux, etc.).

Figure 6G:
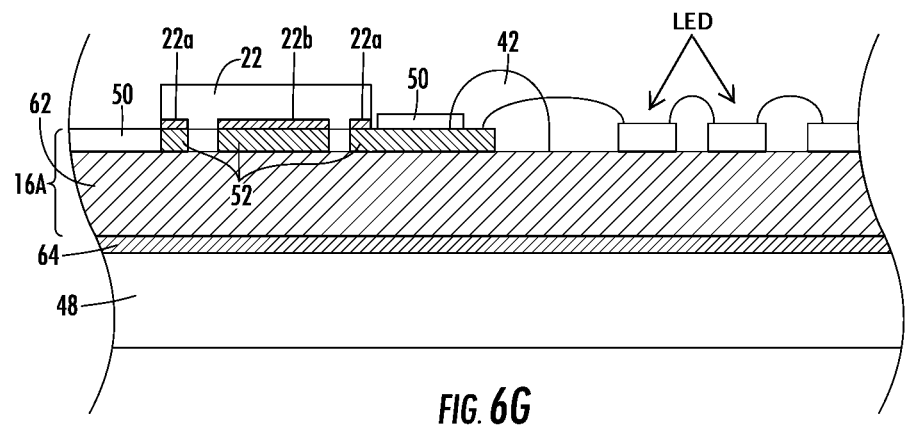

Referring now to FIG. 6G and in some aspects, substrate 16 can be devoid of multiple non-metallic layers. That is, substrate 16 can be devoid of a dielectric layer (e.g., 56, FIG. 6A to 6C). In this aspect, driver chip 22 can be disposed over traces 52 without the need for vias and/or dielectric material. In some aspects, traces 52 are attached directly to base material 62 (e.g., ceramic). Solder mask 50 can cover some portions of traces 52 and leave other portions uncovered so that LED chips, designated "LED" may wirebond to traces 52 via wires or connectors. In some aspects, driver chip 22 and LED chips are disposed on a same surface of substrate 16, for example, via soldering to traces 52. In other aspects, driver chip 22 and LED chips are disposed over different surfaces of substrate 16. LED chips can attach to substrate 16 via an attachment or adhesive agent, such as adhesive, solder (metal or metal alloy), paste, epoxy, or silicone.

Figure 7:
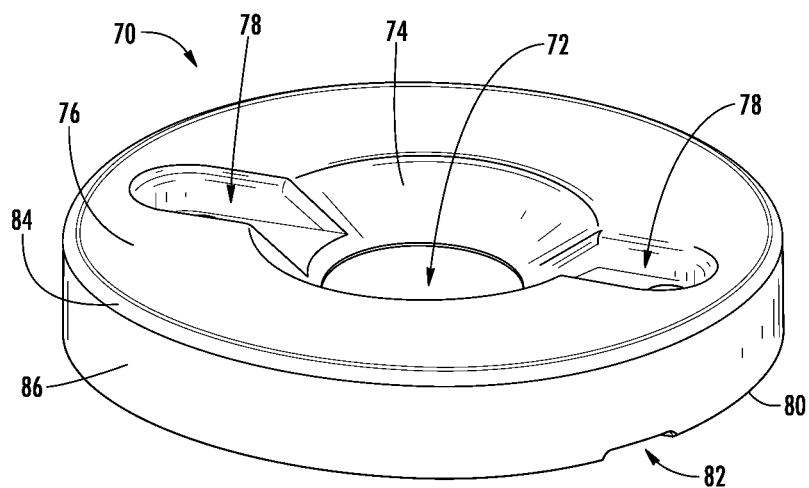
FIG. 7 is a perspective view illustrating a reflective structure or holder for a solid state lighting apparatus according to some aspects.

FIG. 7 is a perspective view of a covering structure or reflective structure, generally designated 70. Reflective structure can be molded, placed, locked, glued, adhered, or otherwise fitted about portions of substrate 16 and drive components (e.g., driver chip 22) or circuitry of apparatus 10, described hereinabove. This can be advantageous, as reflective structure 70 can reduce or eliminate impingement of light generated by apparatus 10 onto surrounding drive circuitry components or elements (e.g., connector, traces, resistors, diodes, fuses, surge protection circuitry, driver chip, etc.). As circuitry, connector, (e.g., C, FIG. 4) and electrical components can absorb or otherwise interfere with light; reflective cover, holder, or structure 70 can advantageously improve brightness of apparatuses described herein by improving and/or increasing reflection therefrom by covering components with a reflective structure, material, or member.

In some aspects, reflective cover, holder, or structure 70 can comprise a molded plastic structure, such as a plastic sleeve or cap, which can be placed over, or molded in situ (after mounting of electrical components to the substrate 16) over portions of apparatus 10 (e.g., FIG. 8A) and some or all of the electrical components (e.g., driver chip, surge protection circuitry, resistors, fuses, diodes, etc.) supported by the substrate 16. Reflective structure 70 can comprise a white or otherwise reflective molded plastic which can optionally contain one or more phosphoric or lumiphoric materials. Notably, current from an AC power source can be routed into apparatus 10 (e.g., FIG. 8A) via portions of structure 70, as wires from an AC power source can extend into, through, and/or plug into structure 70. Notably, structure 70 can house apparatuses and electrical wires from a power source as described herein. Structure 70 can comprise a compact, secure housing for solid state lighting apparatuses described herein.

In some aspects, reflective structure 70 comprises an opening 72 through which emission area (e.g., 32, FIG. 45) and light emitter surface (e.g., optical element 44, FIG. 5) of apparatuses described herein can be disposed. In some aspects, structure 70 retains and fully covers apparatuses described herein, such that only emission area 32 and corresponding light emitter surface or optical element 44 bounded via member 42 may be visible. In some aspects, no portion of substrate (e.g., 16, FIG. 5) and/or electrical components disposed thereon are visible, as such can be covered via structure 70.

In some aspects, reflective structure 70 can comprise an inclined reflective surface extending outwardly from and about opening 72. Reflective surface 74 can extend between an upper surface 76 of structure 70 and a lower surface 80 of structure. Reflective surface 74 is adapted to outwardly reflect light emitted via solid state lighting apparatus (e.g., 10, FIG. 4).

In some aspects, one or more apertures 78 can be provided in upper surface 76 of reflective structure 70. Apertures 78 can be configured to secure structure 70 and apparatuses within a lighting fixture or bulb. One or more mechanical fasteners (not shown), such as screws or pins can be provided within apertures 78 for securing structure 70 and, therefore, apparatuses (e.g., 10, FIG. 4) within a fixture or bulb.

In some aspects, bottom surface 80 of holder can comprise an opening or slot 82 adapted to receive wires from AC power source. Slot 82 can guide or route wires (not shown) from the power source directly into an apparatus encased or housed within structure 70. As FIG. 7 further illustrates, structure may comprise an upper portion 84 and a lower portion 86. Upper and lower portions 84 and 86, respectively, can fittingly engage or lock about portions of a solid state apparatus (e.g., 10, FIG. 4), for housing or fully enveloping all but the light emitter surface and/or emission area 32 of the respective apparatus. This can improve brightness, light extraction, and efficiency of apparatus.

Figure 8A:
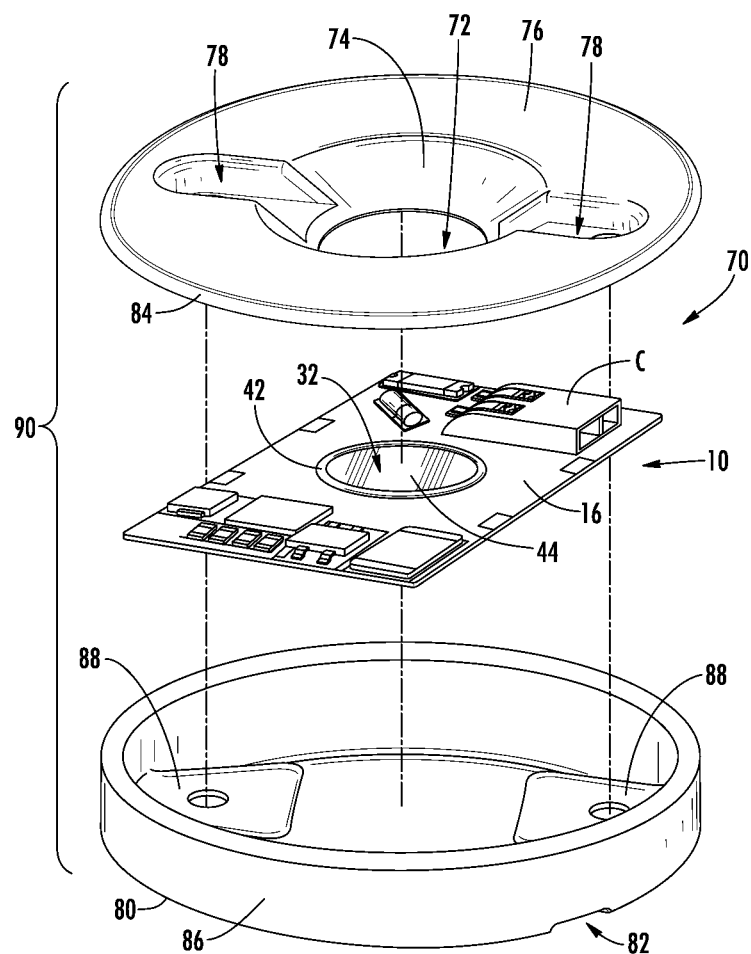
FIGS. 8A and 8B are exploded and perspective views illustrating the reflecting structure or holder of FIG. 7 provided about a portion of a solid state lighting apparatus according to some aspects.
Figure 8B:
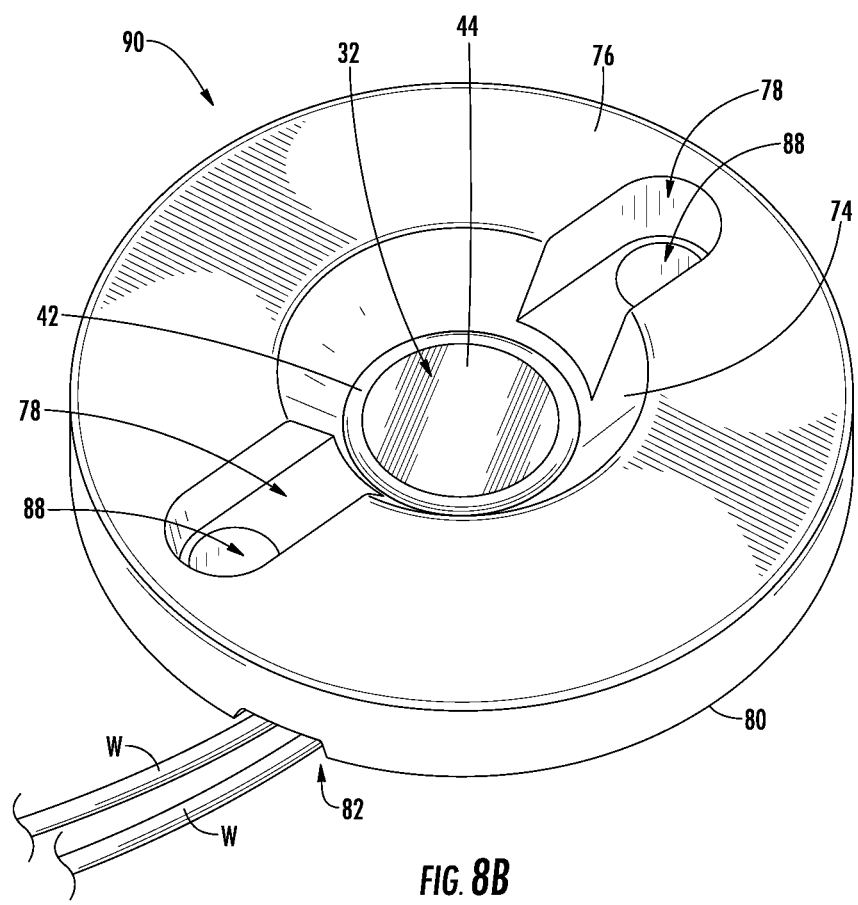

FIGS. 8A and 8B illustrate a solid state lighting system, generally designated 90. Solid state lighting system 90 can comprise solid state lighting apparatus 10 disposed within reflective structure 70. Notably, substrate 16 and electrical components disposed thereon (e.g., fuses, resistors, diodes, driver chip, etc.) can be completely covered and/or housed within structure 70 as illustrated by FIG. 8B. In some aspects, only emission area 32, retaining structure 42, and corresponding optical element 44 or light emitter surface is visible through opening 72 of structure 70.

In some aspects, bottom portion 86 includes one or more retaining members or tabs 88 configured to hold apparatus within structure 70. Upper portion 84 can affix, lock, or otherwise engage lower portion 86 for enclosing, enveloping, and/or housing apparatus 10. Mechanical fasteners (not shown) can extend through portions of lower portion 86 and upper surface 84 for securing system 90 within a lighting fixture. In some aspects, reflective structure 70 can be adapted to receive light from apparatus 10 and specularly or diffusively reflect the received light. In some aspects, reflective structure 70 can comprise a conformal coating disposed over the lighting component, and it may have an opening for wires to be inserted into the connector after assembly.

As FIG. 8B illustrates, wires W from an electrical power source can enter system 90 via slots 82 disposed within lower portion 86 of structure. Notably, wires can carry AC current for directly driving apparatus 10 housed within system 90.

Figure 9:
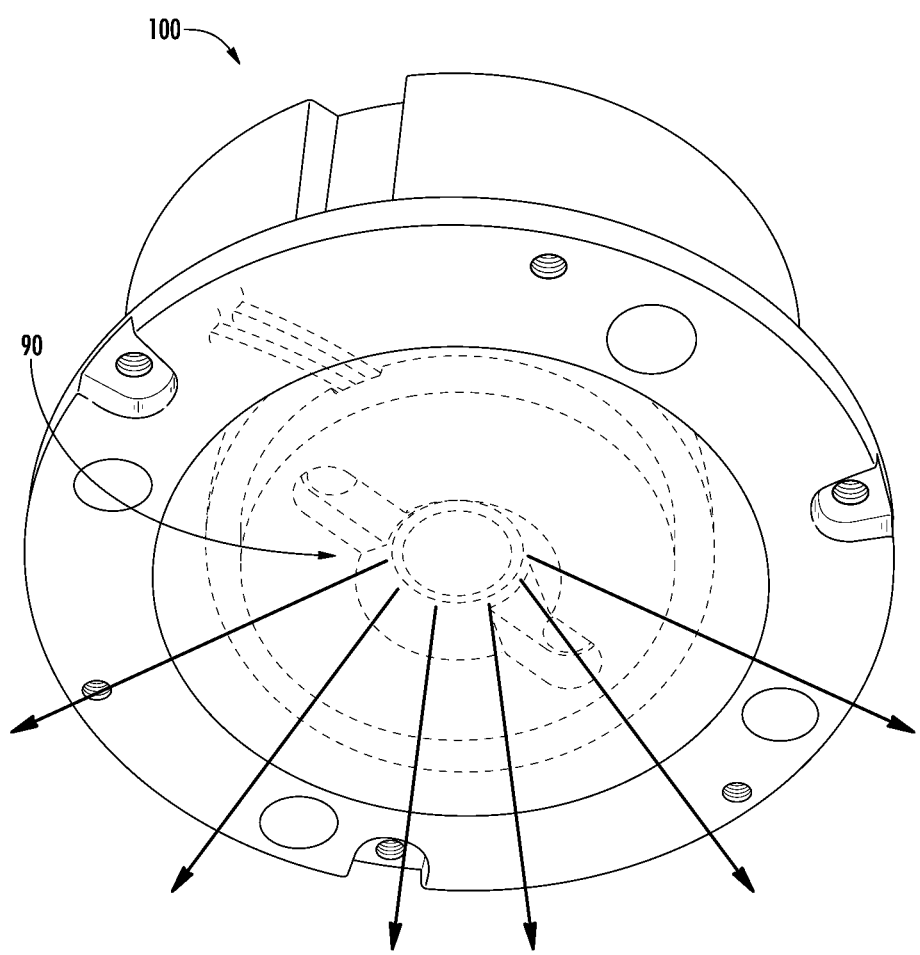
FIG. 9 is a perspective view of a lighting component or fixture including at least one solid state lighting apparatus according to some aspects.

FIG. 9 illustrates a system comprising a lighting fixture, generally designated 100. Lighting fixture 100 can comprise a down light, or can light, adapted to emit light outwardly and/or downwardly as indicated by the arrows. System 90 is indicated in phantom lines for illustration purposes, as it may not be fully visible within fixture 100. Fixture 100 can also comprise any other lighting fixture and/or bulb for any suitable lighting apparatus. For illustration purposes only, a can light is shown, however, any lighting fixture is contemplated. In some aspects, solid state lighting apparatuses described herein can deliver approximately 100 LPW or more (i.e., and 1000 lumens or more) in select color temperatures, such as white color temperatures (e.g., from approximately 1800K to approximately 3000K, or approximately 1800K to approximately 5000K).

In some aspects, each lighting fixture can comprise only one, or more than one, solid state lighting apparatus as described herein (e.g., lighting apparatus 10).

Figure 10A:
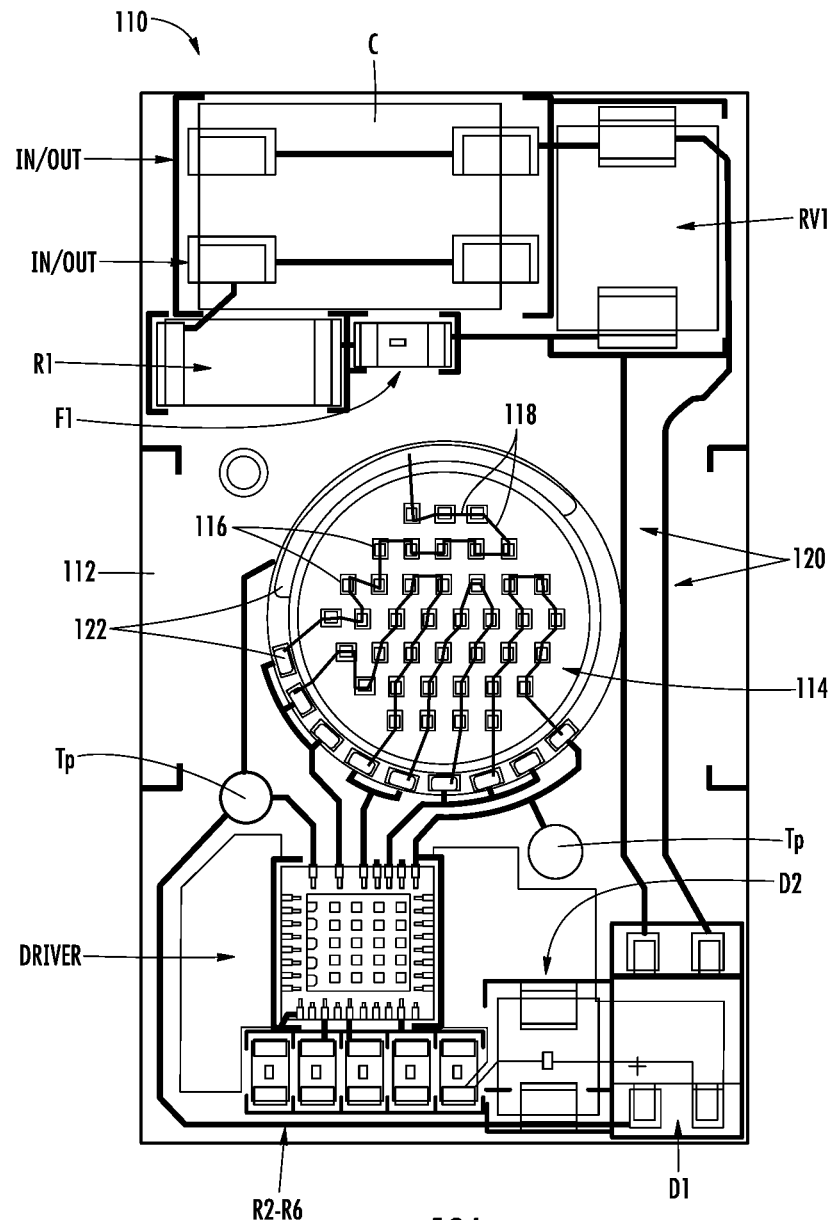
FIGS. 10A to 10C are various plan views illustrating various planar views of a solid state lighting apparatus including multiple solid state light emitters and associated circuitry, on or over a substrate according to some aspects.
Figure 10B:
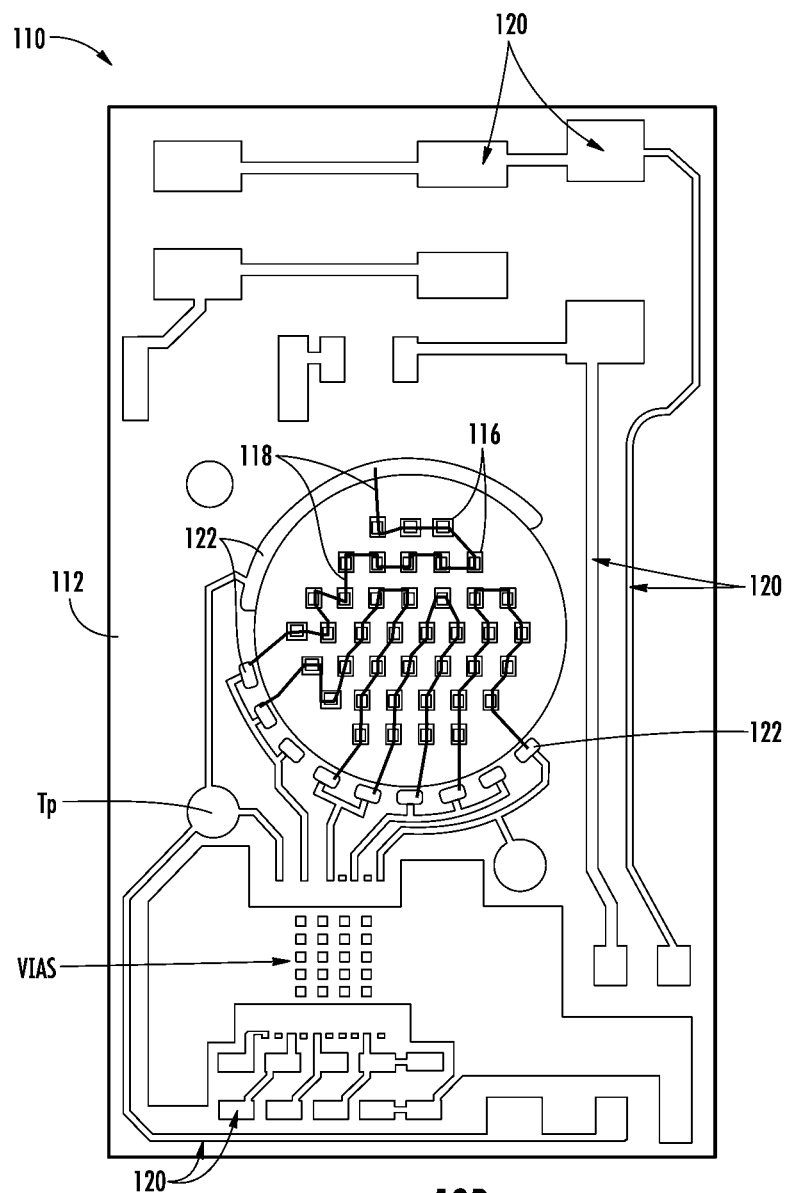
Figure 10C:
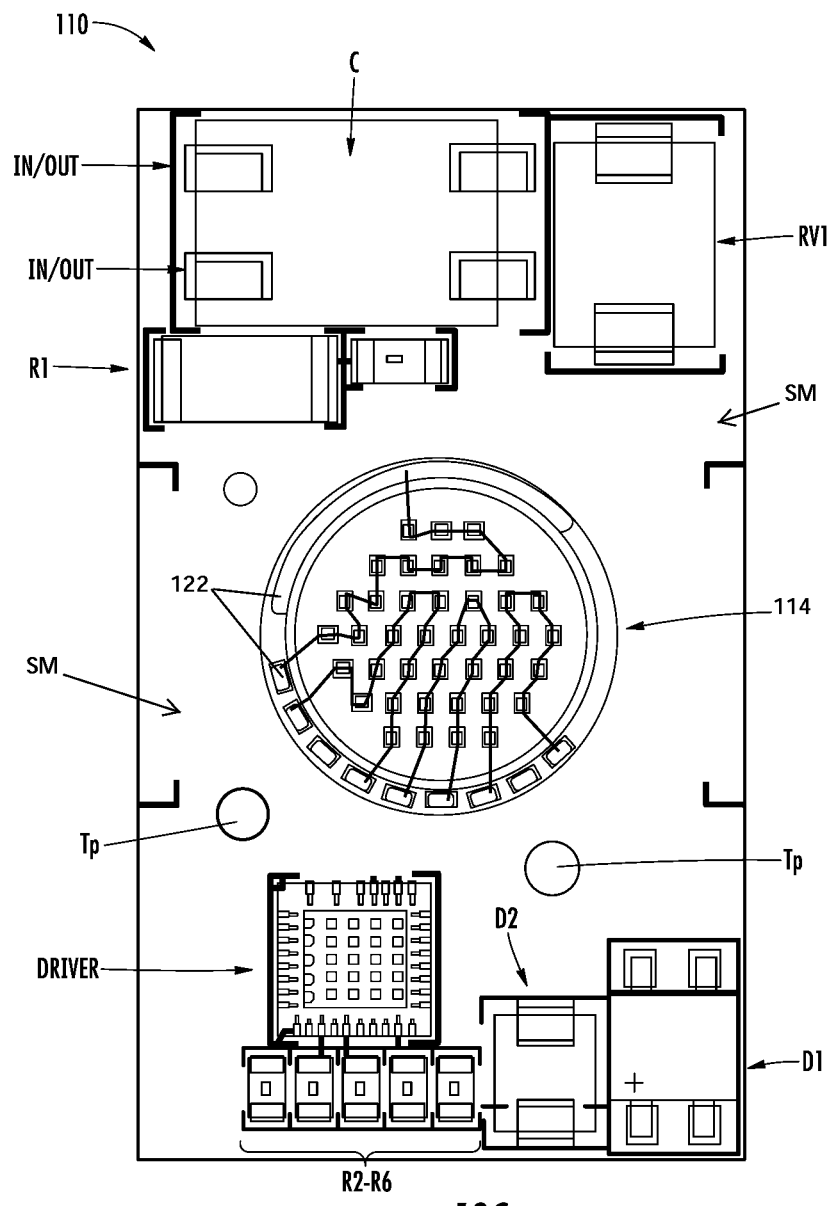

FIGS. 10A to 10C are various schematic plan views illustrating various planar views (e.g., of different planar slices or levels) of a solid state lighting apparatus, generally designed 110. Apparatus 110 can comprise multiple solid state light emitters (e.g., LED chips) and circuitry components, on or over a substrate 112 according to some aspects. FIGS. 10A to 100 illustrate placement of a light emission area 114 with respect to various circuitry components, such as a driver chip or driver component, designated "DRIVER", and various additional electrical or circuitry components (e.g., resistors R1 to R6, surge protection circuitry RV1, etc.), as previously discussed above with respect to FIG. 4. FIGS. 10A to 10C are illustrative of various electrical components, circuitry, and LED chips 116 prior to encapsulating or otherwise covering LED chips 116 with an optical element or filling material. Thus, some features shown in FIGS. 10A to 10C may not be visible during use and/or operation of apparatus 110 (see e.g., FIG. 100 in which some traces electrical connections between components and circuitry may not be visible).

FIG. 10A illustrates one plane of apparatus 110, in which traces and/or connections between electrical components are visible and uncovered. FIG. 10B illustrates a different plane of apparatus 110 prior to attachment of electrical components, thereby illustrating the trace design and/or electrically conductive footprint by which electrical components are connected to each other and/or LED chips 116. FIG. 10C illustrates a top plan view of apparatus 110 in which traces and/or connectors are covered by a reflective material (e.g., a solder mask) but prior to provision of retention structure and/or filling material.

In some aspects, apparatus 110 comprises a substantially rectangular substrate 112 over which a substantially circular light emission area 114 having a substantially circular light emitter surface. Light emission area 114 can be centrally or non-centrally disposed over substrate 112. Any size and/or shape of substrate 112 is contemplated. In some aspects, apparatus 110 can be clamped within a lighting fixture or component between the bracketed "L" portions designated over substrate 112. Substrate 112 can comprise any suitable material as described above.

Emission area 114 comprises one or more LED chips 116 provided over a mounting area. LED chips 116 can be provided in one or more LED segments or strings. Each segment or string may be individually controlled via DRIVER. Strings of LED chips 116 may target approximately same color or different colors depending upon the lighting application and desired output. Any number of LED chips 116 can be serially connected per string. In some aspects, and rather than a string of LED chips, one high-voltage chip having multiple junctions may be utilized.

In some aspects, multiple LED chips 116 within each string may target a same color or different colors. As FIGS. 10A to 10C illustrate, four strings of serially connected LED chips 116 may be provided and serially connected between traces 122. However and as noted hereinabove, more or less than four strings of serially connected LED chips 116 can be provided per apparatus 110. Each string can comprise LED chips 116 serially connected via wirebonds 118. In other aspects, serially connected direct attach (e.g., non-wire-bonded) LED chips may be used. In some aspects, driver component DRIVER can selectively supply current to different tap lines for selectively supplying current to different LED segments according to variations in line voltage and/or timing. As noted above, driver component DRIVER can comprise multiple input circuits or lines in addition to one or more output circuits or lines, which can be configured to control an amount of current that is routed or pushed into respective LED chips 116 and/or strings of LED chips 116.

Substrate 112 is configured to support one more LED chips 116 as well as additional electrical components and/or circuitry. For example, substrate 112 supports an electrical connector C disposed thereon. Connector C can comprise one or more openings in which input wires carrying AC power can be received and directly connected. As indicated by the arrows depicting "IN/OUT", wires from an AC power source can directly connect with apparatus 110 via connector C. AC power can flow directly into apparatus 110 for driving LED segments.

In some aspects, electrical current can be directed across a first fuse F1 and a first resistor designated R1 prior entering a diode bridge D1. Diode bridge D1 can rectify the AC power for providing a rectified AC waveform (e.g. FIG. 3). In the event of a surge (high voltage) pulse beyond normal operating conditions, a portion of the current can be routed to surge protection component RV1. This component can protect the integrity and function of LED chips 116 and/or other components that are not designed to withstand such events. In some aspects, an additional protective component including a TVS diode array D2 can be provided in parallel with diode bridge D1. TVS diode array D2 can be provided for further protection of the LED chips 116 and/or driver component DRIVER from voltage spikes. Various additional resistors R2 to R6 can set the voltage supplied to various set lines of DRIVER. Electrical components (e.g., microelectronic devices such as C, R1 to R6, F1, RV1, D1, D2, etc.) can be electrically connected and/or electrically communicate via traces or electrically conductive communication paths, generally designated 120. Electrical connectivity of apparatus 110 and/or components thereof may be tested via probing various test points $T_P$ disposed over substrate 112. Test points $T_P$ comprise areas of exposed metal that connect to the underlying circuitry of apparatus 110 for testing electrical and/or optical properties thereof.

FIG. 10B illustrates a plan view of apparatus 110 in which traces 122 and/or paths 120 are uncovered, such as prior to attachment of connector C, DRIVER, resistors R1 to R6, fuse F1, surge protection components RV1, D2 and/or diode bridge D1. FIG. 10B illustrates the electrically concoctive paths or channels along which electrical current can be routed through circuitry components and strings of LED chips 116. Notably, one or more vias, designated "VIAS" are disposed below where the driver will be attached for improved heat dissipation and thermal management within apparatus 110.

FIG. 10C illustrates an embodiment in which the traces 122 and/or electrically conductive paths 120 are covered by a reflective material, such as a solder mask SM. As described above and after deposition of solder mask SM, a retention dam (not shown) may be dispensed about emission area 114 and over portions of traces 122 and/or wirebonds 118. An encapsulant or filing material (not shown) may be dispensed over portions of the LED chips 116. The filing maternal may or may not include phosphor as described above.

Apparatus 110 can provide an efficient lighting solution configured to deliver approximately 100 LPW or more in select color temperatures, such as between approximately 1800K and 3000K (i.e., nominally 2700K). In some aspects, apparatus 110 comprises a form factor suitable for replacement of standard light bulbs, elongated fluorescent tube-type bulbs, or replacement of fluorescent light fixtures.

Aspects as disclosed herein can provide one or more of the following beneficial technical effects: improved reliability and lifetime; reduced cost of solid state lighting apparatuses; reduced size or volume of solid state lighting apparatuses; reduced perceptibility of flicker of solid state lighting apparatuses operated with AC power; reduced perceptibility of variation in intensity (e.g., with respect to area and/or direction) of light output by solid state lighting apparatuses operated with AC power; reduced perceptibility of variation (e.g., with respect to area and/or direction) in output color and/or output color temperature of light output by solid state lighting apparatuses operated with AC power; improved dissipation of heat (and concomitant improvement of operating life) of solid state lighting apparatuses operated with AC power; improved manufacturability of solid state lighting apparatuses operated with AC power; improved ability to vary color temperature of emissions of solid state lighting apparatuses operated with AC power; improved light extraction; reduced absorption of light by driver circuitry components; and reduced impingement of light upon driver circuitry or electrical components of a solid state lighting apparatus.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A solid state lighting apparatus, comprising:
   a substrate comprising a non-metallic body having a first surface;
   a plurality of electrical components supported by the first surface of the substrate, wherein at least a portion of one electrical component is spaced from the non-metallic body by one or more non-metallic layers of material;
   an array of solid state light emitters supported by the first surface of the substrate and electrically connected to one or more of the plurality of electrical components, wherein the array of solid state light emitters comprises a first segment of solid state light emitters to emit a first peak wavelength of light and a second segment of solid state light emitters to emit a second peak wavelength of light; and
   a receiver supported by the first surface of the substrate, wherein the receiver receives alternating current (AC) directly from an AC power source.

2. The apparatus of claim 1, wherein the solid state light emitters comprise light emitting diode (LED) chips.

3. The apparatus of claim 1, wherein at least one solid state light emitter is directly disposed on the non-metallic body of the substrate.

4. The apparatus of claim 1, wherein at least one solid state light emitter is attached to the non-metallic body of the substrate using an adhesive agent.

5. The apparatus of claim 1, wherein at least one solid state light emitter adheres to the non-metallic body of the substrate via paste, epoxy, or silicone.

6. The apparatus of claim 1, wherein the one or more non-metallic layers attach to the non-metallic body via adhesive.

7. The apparatus of claim 2, wherein at least two different solid state light emitter segments of the plurality of solid state light emitter segments are activated and/or deactivated at different times relative to one another during a portion of an AC cycle.

8. The apparatus of claim 1, further comprising at least one driver component arranged on or over the substrate, wherein the driver component monitors a line voltage and activates the solid state light emitters during a portion of the AC cycle.

9. The apparatus of claim 8, wherein the driver component is supported by the first surface and packaged.

10. The apparatus of claim 8, wherein the driver component is soldered to at least one electrical component of the substrate.

11. The apparatus of claim 8, wherein the driver component is wirebonded to at least one electrical component of the substrate.

12. The apparatus of claim 1, wherein at least one electrical component is directly attached to the non-metallic body.

13. The apparatus of claim 1, wherein a thermally conductive material is provided between at least one electrical component and the non-metallic body.

14. The apparatus of claim 1, further comprising at least one optical element positioned over the one or more solid state light emitters of the array of solid state light emitters.

15. The apparatus of claim 14, wherein the optical element comprises phosphor.

16. The apparatus of claim 1, wherein at least one of the first and second light emitter segments targets a color temperature of approximately 2700K or below and another of the first and second light emitter segment targets a color temperature of approximately 2700K or above.

17. The apparatus of claim 1, wherein at least one of the first and second solid state light emitter segment targets a color temperature of approximately 1800K.

18. The apparatus of claim 1, wherein the receiver comprises a connector component comprising at least two openings for receiving portions of the AC power source for delivering AC current to the solid state light emitters.

19. The apparatus of claim 1, wherein the receiver comprises a circuit or a circuit element.

20. The apparatus of claim 1, further comprising electrically conductive vias provided within the substrate, wherein the vias are provided below either the solid state light emitters or a packaged driver component for dissipating heat therefrom.

21. The apparatus of claim 1, wherein at least one of the non-metallic layers comprises FR-4, fiberglass reinforced epoxy, polyimide, or a PCB laminate material.

22. The apparatus of claim 1, wherein non-metallic body comprises alumina (Al2O3), a ceramic, or a high reflectivity alumina.

23. The apparatus of claim 1, further comprising a reflective structure that routes AC current from the AC power source into the solid state lighting apparatus.

24. The apparatus of claim 23, wherein the structure comprises a top portion and a bottom portion encloses portions of the apparatus, such that only a light emission area of the apparatus is visible from an outside view.

25. The apparatus of claim 23, wherein the reflective structure is white.

26. The apparatus of claim 23, wherein the reflective structure comprises molded plastic.

27. The apparatus of claim 23, wherein the reflective structure comprises a slotted opening that receives electrical connectors from the AC power source directly into the apparatus.

28. The apparatus of claim 23, wherein the reflective structure comprises an inclined reflective surface extending between an opening of the structure and an uppermost surface of the structure.

29. The apparatus of claim 1, wherein a driver component is mounted to the first surface of the substrate.

30. The apparatus of claim 29, wherein the solid state light emitters comprise LED chips, and wherein a first LED chip is mounted to the first surface such that the first chip is planar with the driver component.

31. The apparatus of claim 30, wherein the driver component is wirebonded to at least one electrical component.

32. The apparatus of claim 31, wherein the driver component is wirebonded to the first LED chip.

33. The apparatus of claim 30, wherein a reflective structure is disposed between the driver component and the first LED chip.

34. The apparatus of claim 1, wherein the AC current received by the receiver is rectified.

35. A solid state lighting system, comprising:
a substrate comprising a non-metallic body and one or more non-metallic layers, the non-metallic body having a top surface;
one or more solid state light emitters disposed on the top surface;
a plurality of electrical components disposed over the top surface and electrically coupled to the one or more solid state light emitters, wherein at least a portion of one electrical component is spaced from the non-metallic body by the one or more non-metallic layers of material; and
a plurality of electrically conductive vias provided in at least one non-metallic layer disposed between the at least one electrical component and the non-metallic body of the substrate.

36. The system of claim 35, wherein the vias are provided below the solid state light emitters and a packaged driver component for dissipating heat therefrom.

37. The system of claim 35, wherein at least one electrical component is directly disposed on the non-metallic body.

38. The system of claim 35, wherein a thermally conductive material is provided between at least one electrical component and the non-metallic body.

39. The system of claim 35, wherein at least one solid state light emitter is directly disposed on the non-metallic body of the substrate.

40. The system of claim 35, further comprising a receiver supported by the top surface, wherein the receiver receives alternating current (AC) directly from an AC power source.

41. The system of claim 35, wherein the solid state light emitters comprise a plurality of solid state light emitter segments, each segment comprising at least one solid state light emitter.

42. The system of claim 35, further comprising a driver component arranged on or over the top surface, wherein the driver component monitors a line voltage and activates the solid state light emitters during a portion of an AC cycle.

43. The system of claim 35, wherein the driver component is soldered to at least one electrical component of the substrate.

44. The system of claim 35, wherein the driver component is wirebonded to at least one electrical component of the substrate.

45. A solid state lighting apparatus, comprising:
a substrate comprising a non-metallic body having a first surface;
one or more electrical components supported by the first surface of the substrate;
an array of solid state light emitters supported by the first surface of the substrate and electrically coupled to the one or more electrical components thereof, wherein the array of solid state light emitters comprises a first segment of solid state light emitters to emit a first peak wavelength of light and a second segment of solid state light emitters to emit a second peak wavelength of light; and
a receiver supported by the first surface of the substrate, wherein the receiver receives alternating current (AC) directly from an AC power source.

46. The apparatus of claim 45, wherein the solid state light emitter comprise light emitting diode (LED) chips.

47. The apparatus of claim 45, wherein at least one solid state light emitter is attached to the non-metallic body of the substrate via an attachment agent.

48. The apparatus of claim 45, wherein at least one solid state light emitter adheres to the non-metallic body of the substrate via paste, adhesive, epoxy, or silicone.

49. The apparatus of claim 45, further comprising at least one driver component arranged on or over the substrate, wherein the driver component monitors a line voltage and activates the solid state light emitters during a portion of the AC cycle.

50. The apparatus of claim 49, wherein the driver component is supported by at least one of the electrical components.

51. The apparatus of claim 49, wherein the driver component is soldered to the electrical component.

52. The apparatus of claim 45, wherein the non-metallic body comprises alumina.

53. The apparatus of claim 45, further comprising at least one other electrical component arranged on or over the substrate, the at least one other electrical component comprises at least one resistor, fuse, diode, microelectronic device, or connector.

\* \* \* \* \*